(12) United States Patent
Suzuki et al.

(10) Patent No.: US 8,455,954 B2
(45) Date of Patent: Jun. 4, 2013

(54) WIRELESS CHIP AND ELECTRONIC APPLIANCE HAVING THE SAME

(75) Inventors: Yukie Suzuki, Isehara (JP); Yasuyuki Arai, Atsugi (JP); Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/445,262

(22) Filed: Apr. 12, 2012

(65) Prior Publication Data
US 2012/0193694 A1    Aug. 2, 2012

Related U.S. Application Data

(62) Division of application No. 11/354,825, filed on Feb. 16, 2006, now abandoned.

(30) Foreign Application Priority Data

Mar. 8, 2005  (JP) ................................. 2005-064271

(51) Int. Cl.
*H01L 27/11* (2006.01)
(52) U.S. Cl.
USPC ............ 257/379; 257/528; 438/155; 438/238
(58) Field of Classification Search
None
See application file for complete search history.

(56) References Cited

U.S. PATENT DOCUMENTS

| 5,404,581 | A | * | 4/1995 | Honjo ........................ 455/90.1 |
| 5,643,804 | A | | 7/1997 | Arai et al. |
| 5,877,533 | A | | 3/1999 | Arai et al. |
| 5,939,784 | A | | 8/1999 | Glenn |
| 6,018,299 | A | | 1/2000 | Eberhardt |
| 6,091,332 | A | | 7/2000 | Eberhardt et al. |
| 6,107,920 | A | | 8/2000 | Eberhardt et al. |
| 6,130,613 | A | | 10/2000 | Eberhardt et al. |

(Continued)

FOREIGN PATENT DOCUMENTS

| CN | 1305623 | 7/2001 |
| EP | 1 143 562 A | 10/2001 |

(Continued)

OTHER PUBLICATIONS

Office Action (Application No. 200610058896.4) dated Mar. 6, 2009.

(Continued)

*Primary Examiner* — Evan Pert
*Assistant Examiner* — Andres Munoz
(74) *Attorney, Agent, or Firm* — Eric J. Robinson; Robinson Intellectual Property Law Office, P.C.

(57) ABSTRACT

The present invention provides a wireless chip having high mechanical strength. Moreover, the present invention also provides a wireless chip which can prevent an electric wave from being blocked. In a wireless chip of the present invention, a layer having a thin film transistor formed over an insulating substrate is fixed to an antenna by an anisotropic conductive adhesive, and the thin film transistor is connected to the antenna. The antenna has a dielectric layer, a first conductive layer, and a second conductive layer; the first conductive layer and the second conductive layer has the dielectric layer therebetween; the first conductive layer serves as a radiating electrode; and the second electrode serves as a ground contact body.

20 Claims, 18 Drawing Sheets

U.S. PATENT DOCUMENTS

| | | | |
|---|---|---|---|
| 6,157,047 A | 12/2000 | Fujita et al. | |
| 6,246,327 B1 | 6/2001 | Eberhardt | |
| 6,319,827 B1 | 11/2001 | Kowalski et al. | |
| 6,331,722 B1 | 12/2001 | Yamazaki et al. | |
| 6,384,785 B1 | 5/2002 | Kamogawa et al. | |
| 6,410,960 B1 | 6/2002 | Arai et al. | |
| 6,559,798 B1 | 5/2003 | Marumoto et al. | |
| 6,677,901 B1 | 1/2004 | Nalbandian | |
| 7,160,258 B2 | 1/2007 | Imran et al. | |
| 7,518,692 B2 | 4/2009 | Yamazaki et al. | |
| 7,772,063 B2 | 8/2010 | Novosel | |
| 8,310,399 B2 * | 11/2012 | Yamazaki et al. | 343/700 MS |
| 2002/0047803 A1 | 4/2002 | Ishitobi et al. | |
| 2002/0134981 A1 | 9/2002 | Nakamura et al. | |
| 2003/0052712 A1 | 3/2003 | Comer | |
| 2003/0169207 A1 | 9/2003 | Beigel | |
| 2004/0036148 A1 | 2/2004 | Block et al. | |
| 2004/0102176 A1 | 5/2004 | Hayashi et al. | |
| 2004/0164302 A1 | 8/2004 | Arai et al. | |
| 2004/0196095 A1 | 10/2004 | Nonaka | |
| 2004/0217347 A1 | 11/2004 | Tripsas et al. | |
| 2004/0238864 A1 | 12/2004 | Tripsas et al. | |
| 2004/0246099 A1 | 12/2004 | Tuttle | |
| 2004/0256973 A1 | 12/2004 | Imamura | |
| 2005/0032260 A1 | 2/2005 | Mears et al. | |
| 2005/0046464 A1 | 3/2005 | Koyayashi et al. | |
| 2005/0079662 A1 | 4/2005 | Miki | |
| 2006/0009251 A1 | 1/2006 | Noda et al. | |
| 2006/0049986 A1 | 3/2006 | Dunn et al. | |
| 2009/0066589 A1 * | 3/2009 | Yamazaki et al. | 343/702 |

FOREIGN PATENT DOCUMENTS

| | | | |
|---|---|---|---|
| EP | 1 437 683 A | | 7/2004 |
| JP | 01-173696 A | | 7/1989 |
| JP | 03-132095 A | | 6/1991 |
| JP | 07-045787 A | | 2/1995 |
| JP | 08-139522 A | | 5/1996 |
| JP | 09-001970 | | 1/1997 |
| JP | 2000-196334 A | | 7/2000 |
| JP | 2001101368 A | * | 4/2001 |
| JP | 2001-177314 A | | 6/2001 |
| JP | 2001177314 A | * | 6/2001 |
| JP | 2002-313811 | | 10/2002 |
| JP | 2004-220591 A | | 8/2004 |
| JP | 2004-282050 A | | 10/2004 |
| JP | 2004-538055 | | 12/2004 |
| JP | 2006-024087 A | | 1/2006 |
| WO | WO 99/65002 | | 12/1999 |
| WO | WO 99/67754 | | 12/1999 |
| WO | WO 00/16278 | | 3/2000 |
| WO | WO 00/16279 | | 3/2000 |

OTHER PUBLICATIONS

Chinese Office Action (Application No. 201010241495.9) dated Jul. 26, 2011.

Machine translation of JP 09-001970's detailed description, 3 pages.

* cited by examiner

WIRELESS CHIP AND ELECTRONIC APPLIANCE HAVING THE SAME

BACKGROUND OF THE INVENTION

1. Field of the Invention

The present invention relates to a wireless chip which can send and receive data through wireless communication and an electronic appliance having the wireless chip.

2. Description of the Related Art

In recent years, development of a wireless chip including a plurality of circuits and an antenna has been advanced. Such a wireless chip is referred to as an ID tag, an IC tag, an IC chip, an RF (Radio Frequency) tag, a wireless tag, an electronic tag, or an RFID (Radio Frequency IDentification) tag, and has been already introduced into some markets.

Many of these wireless chips which are currently in practical use have circuits using semiconductor substrates such as silicon (such circuits are also referred to as IC (Integrated Circuit) chips) and antennas. The antenna is formed by a printing method, a method in which a conductive thin film is etched, a plating method, or the like (see, for example, Patent Document 1: Japanese Patent Application Laid-Open No. H9-1970).

The antenna formed by the above method is a thin film or a thick film. The antenna attached to a flexible material such as paper or plastic has a problem in that the antenna is sensitive to bending or folding, so that a part of the antenna is easily broken.

Moreover, in the case of a wireless chip formed using a semiconductor substrate, the semiconductor substrate serves as a conductor and blocks an electric wave; therefore, there is a problem in that a signal is easily attenuated depending on a direction from which a signal is sent.

SUMMARY OF THE INVENTION

In view of the above problems, it is an object of the present invention to provide a wireless chip in which mechanical strength can be increased. Moreover, it is an object of the present invention to provide a wireless chip which can prevent an electric wave from being blocked.

In a wireless chip of the present invention, a layer having a thin film transistor formed over an insulating substrate is fixed to an antenna by an anisotropic conductive adhesive or a conductive layer, and the thin film transistor is connected to the antenna. Moreover, the layer having the thin film transistor formed over the insulating substrate, a passive element, and the antenna are fixed to each other by an anisotropic conductive adhesive or a conductive layer, and the thin film transistor or the passive element is connected to the antenna.

The layer having a thin film transistor may be formed by stacking a plurality of layers having thin film transistors. Alternatively, the plurality of layers having thin film transistors may be fixed to each other by an anisotropic conductive adhesive. Further, the passive element may be a plurality of passive elements such as an inductor, a condenser (capacitor), and a resistor.

The antenna has a dielectric layer, a first conductive layer, and a second conductive layer, wherein the first conductive layer and the second conductive layer have the dielectric layer sandwiched therebetween and wherein the first conductive layer serves as a radiating electrode and the second conductive layer serves as a ground contact body. Moreover, the antenna has a power feeding layer or a power feeding point.

Further, the present invention includes the following structures.

A wireless chip of the present invention includes a layer having a thin film transistor formed over an insulating substrate; a connection terminal which is formed on a surface of the layer having the thin film transistor and which is connected to the thin film transistor; an antenna having a first conductive layer serving as a radiating electrode, a second conductive layer serving as a ground contact body, and a dielectric layer sandwiched between the first conductive layer and the second conductive layer; and an organic resin layer having a conductive particle for connecting the antenna and the connection terminal. Moreover, the wireless chip may have a third conductive layer, instead of the organic resin layer having a conductive particle, for connecting the antenna and the connection terminal.

A wireless chip of the present invention includes a layer having a thin film transistor formed over an insulating substrate; a first connection terminal and a second connection terminal which are formed on a surface of the layer having the thin film transistor and which are connected to the thin film transistor; an antenna having a dielectric layer, a first conductive layer serving as a radiating electrode on a first plane of the dielectric layer, a second conductive layer serving as a ground contact body on a second plane which opposes to the first plane through the dielectric layer, and a third conductive layer serving as a power feeding body formed on the first plane, the second plane, and a third plane which is in contact with the first plane and the second plane; and an organic resin layer having a conductive particle for connecting the first connection terminal and the second conductive layer, and the second connection terminal and the third conductive layer. The wireless chip may have a fourth conductive layer and a fifth conductive layer, instead of the organic resin layer having a conductive particle, for connecting the first connection terminal and the second conductive layer, and the second connection terminal and the third conductive layer.

A wireless chip of the present invention includes a layer having a thin film transistor formed over an insulating substrate; a first connection terminal which is formed on a surface of the layer having the thin film transistor and which is connected to the thin film transistor; a layer having one or more passive elements selected from an inductor, a condenser (capacitor), and a resistor; a second connection terminal formed on a first plane of the layer having the one or more passive elements; a third connection terminal formed on a second plane which opposes to the first plane; a first organic resin layer having a conductive particle for connecting the first connection terminal and the second connection terminal; an antenna having a first conductive layer serving as a radiating electrode, a second conductive layer serving as a ground contact body, and a dielectric layer sandwiched between the first conductive layer and the second conductive layer; and a second organic resin layer having a conductive particle for connecting the third connection terminal and the antenna. The wireless chip may have a third conductive layer, instead of the organic resin layer having a conductive particle, for connecting the antenna and the third connection terminal.

The layer having the thin film transistor may be formed by stacking a plurality of layers having thin film transistors. Over the insulating substrate, a region where the layer having the thin film transistor is to be formed may be different from a region where the antenna is to be provided.

A wireless chip of the present invention includes a first layer having a first thin film transistor formed over an insulating substrate; a first connection terminal which is formed on a surface of the first layer and which is connected to the first thin film transistor; a second layer having a second thin film transistor; a second connection terminal formed on a first plane of the second layer; a third connection terminal formed on a second plane which opposes to the first plane; a first organic resin layer having a conductive particle for connecting the first connection terminal and the second connection terminal; an antenna having a first conductive layer serving as a radiating electrode, a second conductive layer serving as a ground contact body, and a dielectric layer sandwiched between the first conductive layer and the second conductive layer; and a second organic resin layer having a conductive particle for connecting the third connection terminal and the antenna. The wireless chip may have a third conductive layer, instead of the organic resin layer having a conductive particle, for connecting the antenna and the third connection terminal.

A wireless chip of the present invention includes a first layer having a first thin film transistor formed over an insulating substrate; a first connection terminal which is formed on a surface of the first layer and which is connected to the first thin film transistor; a second layer having a second thin film transistor; a second connection terminal formed on a first plane of the second layer; a third connection terminal formed on a second plane which opposes to the first plane; a first organic resin layer having a conductive particle for connecting the first connection terminal and the second connection terminal; a layer having one or more passive elements selected from an inductor, a condenser (capacitor), and a resistor; a fourth connection terminal formed on a first plane of the layer having the one or more passive elements; a fifth connection terminal formed on a second plane which opposes to the first plane of the layer having the one or more passive elements; a second organic resin layer having a conductive particle for connecting the third connection terminal and the fourth connection terminal; an antenna having a first conductive layer serving as a radiating electrode, a second conductive layer serving as a ground contact body, and a dielectric layer sandwiched between the first conductive layer and the second conductive layer; and a third organic resin layer having a conductive particle for connecting the fifth connection terminal and the antenna.

A wireless chip of the present invention includes a first layer having a first thin film transistor formed over an insulating substrate; a first connection terminal which is formed on a surface of the first layer and which is connected to the first thin film transistor; a second layer having a second thin film transistor; a second connection terminal formed on a first plane of the second layer; a third connection terminal formed on a second plane which opposes to the first plane; a first conductive layer for connecting the first connection terminal and the second connection terminal; a layer having one or more passive elements selected from an inductor, a condenser (capacitor), and a resistor; a fourth connection terminal formed on a first plane of the layer having the one or more passive elements; a fifth connection terminal formed on a second plane which opposes to the first plane of the layer having the one or more passive elements; a second conductive layer for connecting the third connection terminal and the fourth connection terminal; an antenna having a third conducive layer serving as a radiating electrode, a fourth conductive layer serving as a ground contact body, and a dielectric layer sandwiched between the third conductive layer and the fourth conductive layer; and a fifth conductive layer for connecting the fifth connection terminal and the antenna.

Over the insulating substrate, a region where the first layer and the second layer are to be formed may be different from a region where the antenna is to be provided.

The layer having the thin film transistor, the first layer, and the second layer have thicknesses in the range of 1 to 10 μm, preferably 1 to 5 μm.

A wireless chip of the present invention includes a layer which is formed over an insulating substrate and which has a first thin film transistor, a second thin film transistor, and a first antenna connected to the first thin film transistor; a connection terminal which is formed on a surface of the layer having the first thin film transistor, the second thin film transistor, and the first antenna connected to the first thin film transistor and which is connected to the second thin film transistor; a second antenna having a first conductive layer serving as a radiating electrode, a second conductive layer serving as a ground contact body, and a dielectric layer sandwiched between the first conductive layer and the second conductive layer; and an organic resin layer having a conductive particle for connecting the connection terminal and the second antenna. The wireless chip may have a third conductive layer, instead of the organic resin layer having a conductive particle, for connecting the second antenna and the connection terminal.

The wireless chip may have a central processing unit or a detection portion, in addition to a high frequency circuit.

Further, the insulating substrate is preferably an inflexible insulating substrate, and a glass substrate or a quartz substrate is typically used.

The dielectric layer is formed with ceramic, an organic resin, or a mixture of ceramic and an organic resin. As typical examples of ceramic, alumina, glass, forsterite, barium titanate, lead titanate, strontium titanate, lead zirconate, lithium niobate, and lead zirconium titanate are given. As typical examples of the dielectric layer, an epoxy resin, a phenol resin, a polybutadiene resin, a bismaleimide triazine resin, vinylbenzyl, and polyfumarate are given.

The present invention provides an electronic appliance having the above wireless chip. As typical examples of the electronic appliance, a liquid crystal display device, an EL display device, a television device, a mobile phone, a printer, a camera, a personal computer, a speaker device, a headphone, a navigation device, and an electronic key are given.

The layer having the thin film transistor formed over the insulating substrate can be formed so as to have almost the same dimension as the antenna. The insulating substrate serves as a protector for the layer having the thin film transistor as well as a protector for the antenna. Therefore, the mechanical strength of the wireless chip increases.

Since a patch antenna has high mechanical strength, the patch antenna can be used repeatedly. Therefore, a wireless chip having a patch antenna can be provided to a recyclable container such as a returnable container.

Further, since an integrated circuit is formed using electrically-isolated thin film transistors in a wireless chip of the present invention, an electric wave is more difficult to be blocked than in a wireless chip having an integrated circuit formed using a semiconductor substrate, thereby suppressing the attenuation of a signal due to the block of an electric wave. Thus, it is possible to send and receive data with high efficiency.

Since a wireless chip including an integrated circuit which is formed using a thin film transistor and a passive element formed with a thick film pattern has each circuit formed with an element having an appropriate function, the wireless chip has composite functions. By mounting a wireless chip of the present invention to a wiring substrate, the number of mount parts can be decreased, thereby allowing the size reduction of a wiring substrate dimension as well as the electronic appliance having the wiring substrate.

DETAILED DESCRIPTION OF THE INVENTION

Embodiment Mode

Figure 1A:
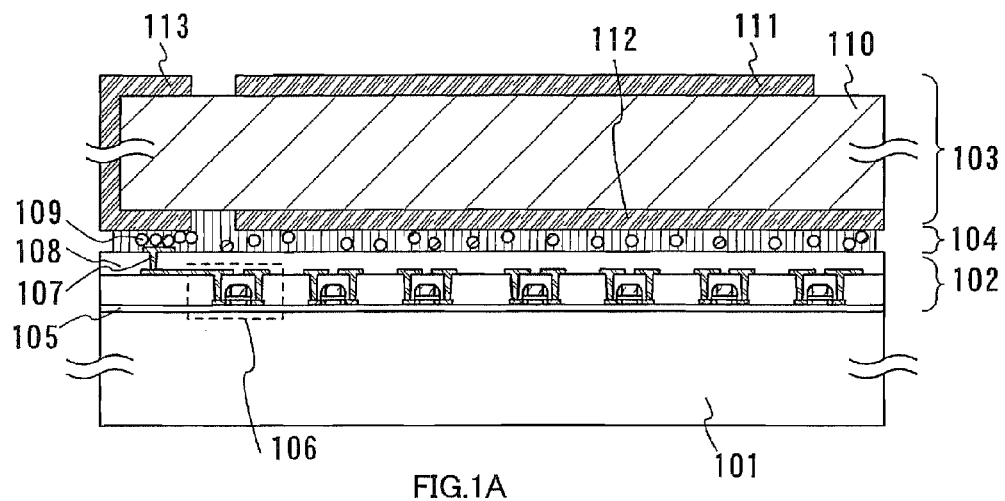
FIGS. 1A and 1B are cross-sectional views showing a wireless chip of the present invention.

Embodiment Modes and Embodiments of the present invention will be described with reference to the drawings. However, since the present invention can be embodied with many different modes, it is easily understood by those skilled in the art that the mode and detail can be variously modified without departing from the scope of the present invention. Therefore, the present invention is not construed as being limited to the description of Embodiment Modes and Embodiments. In all the drawings for describing Embodiment Modes and Embodiments, the same reference numerals are given to the parts having similar functions or the same functions, and the description to such parts is not made repeatedly.

Embodiment Mode 1

Figure 1B:
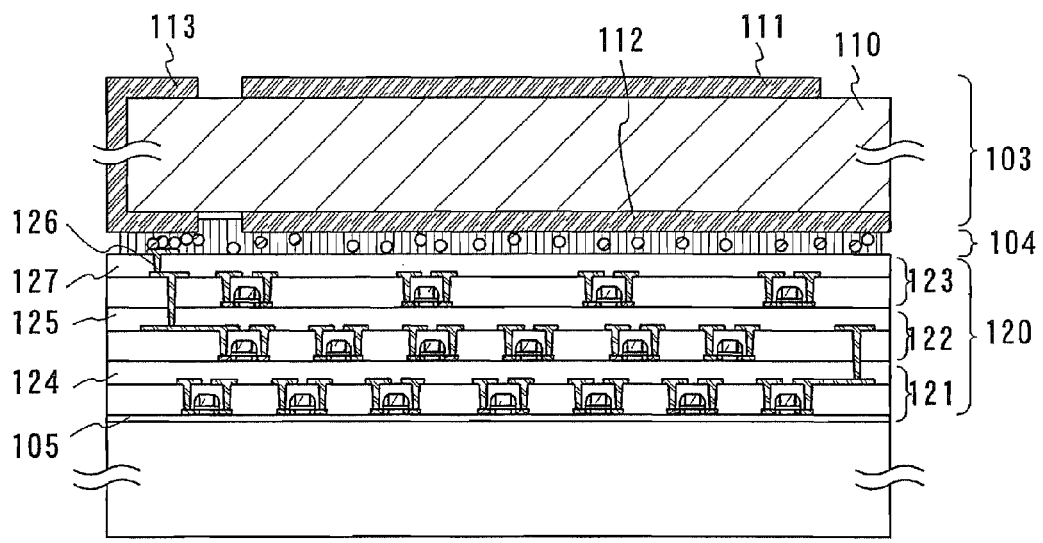

An embodiment mode of a wireless chip of the present invention is shown in FIGS. 1A and 1B. FIGS. 1A and 1B are cross-sectional views of a wireless chip.

In a wireless chip of this embodiment mode, a layer 102 having a thin film transistor formed over an insulating substrate 101 is fixed to an antenna 103 by an anisotropic conductive adhesive 104. Moreover, a connection terminal 107 of the layer 102 having a thin film transistor and a power feeding layer 113 of the antenna are electrically connected by conductive particles 109 dispersed in the anisotropic conductive adhesive 104. Further, although not shown, a ground wiring of the layer having a thin film transistor is electrically connected to a conductive layer serving as a ground contact body of the antenna.

As the insulating substrate 101, an inflexible insulating substrate is preferred. A quartz substrate or a glass substrate such as a nonalkali glass substrate is used.

The layer 102 having a thin film transistor includes an insulating layer 105 formed on a surface of the insulating substrate 101, a thin film transistor 106 formed over the insulating layer 105, an interlayer insulating layer 108 formed over the thin film transistor 106, and a connection terminal 107 which is exposed at a surface of the interlayer insulating layer 108 and which is connected to the thin film transistor 106. The layer 102 having a thin film transistor may have a resistance element, a condenser (capacitor), and the like, in addition to the thin film transistor.

The insulating substrate 101 and the layer 102 having a thin film transistor formed over the insulating substrate 101 are preferably as large as the antenna 103, which is several mm×several mm to several tens mm×several tens mm. Moreover, the thickness of the layer having a thin film transistor ranges from several μm to several tens μm, typically from 1 to 10 μm and preferably from 2 to 5 μm.

The insulating layer 105 formed on the surface of the insulating substrate 101 is provided in the case that the insulating substrate 101 is a nonalkali glass substrate. The insulating layer 105 can prevent the movement of movable ions in the nonalkali glass substrate. The insulating layer 105 is formed with silicon oxide, silicon oxynitride, silicon nitride oxide, silicon nitride, or the like by a known method such as a sputtering method or a plasma CVD method.

Figure 18A:
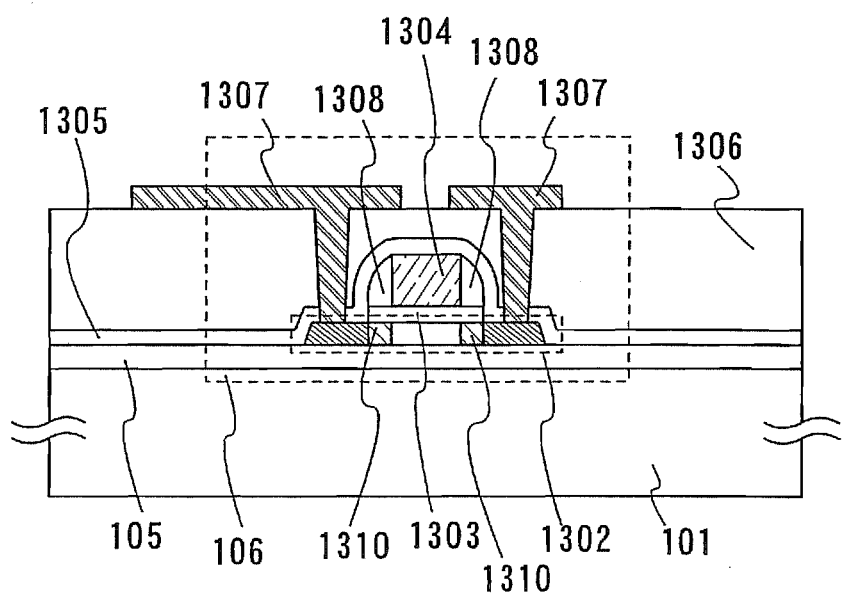
FIGS. 18A and 18B are cross-sectional views showing a thin film transistor applicable to the present invention.

A mode of the thin film transistor 106 is described with reference to FIGS. 18A and 18B. FIG. 18A shows an example of a top gate thin film transistor. The insulating layer 105 is formed over the insulating substrate 101, and the thin film transistor 106 is provided over the insulating layer 105. In the thin film transistor 106, a semiconductor layer 1302 is provided over the insulating layer 105 and an insulating layer 1303 serving as a gate insulating layer is provided over the semiconductor layer 1302. Over the insulating layer 1303, a gate electrode 1304 corresponding to the semiconductor layer 1302 is formed. An insulating layer 1305 serving as a protective layer is formed over the gate electrode 1304, and an insulating layer 1306 serving as an interlayer insulating layer is provided over the insulating layer 1305. An insulating layer serving as a protective layer may be further provided over the insulating layer 1306.

The semiconductor layer 1302 is a layer formed with a semiconductor having a crystal structure. A non-single crystal semiconductor or a single crystal semiconductor can be used. In particular, it is preferable to use a crystalline semiconductor obtained by crystallizing amorphous or microcrystalline semiconductor with laser irradiation, a crystalline semiconductor obtained by crystallizing amorphous or microcrystalline semiconductor through a heat treatment, or a crystalline semiconductor obtained by crystallizing amorphous or microcrystalline semiconductor with a combination of a heat treatment and laser irradiation. In the heat treatment, a crystallization method using a metal element such as nickel which can promote crystallization of silicon semiconductor can be used.

In the case of the crystallization with laser irradiation, it is possible to conduct crystallization in such a way that a portion in a crystalline semiconductor that is melted by irradiation with laser light is continuously moved in a direction where the laser light is delivered, wherein the laser light is continuous wave laser light or ultrashort pulsed laser light having a high repetition rate of 10 MHz or more and a pulse width of 1 nanosecond or less, preferably 1 to 100 picoseconds. By using such a crystallization method, a crystalline semiconductor having a large grain diameter with a crystal grain boundary extending in one direction can be obtained. By making a drift direction of carriers conform to the direction where the crystal grain boundary extends, the electric field effect mobility in the transistor can be increased. For example, 400 cm$^2$/V·sec or more can be achieved.

In the case of applying the above crystallization step to a crystallization process where the temperature is not more than the upper temperature limit of a glass substrate (approximately 600° C.), a large glass substrate can be used. Therefore, a large number of wireless chips can be manufactured with one substrate, and the cost can be decreased.

The semiconductor layer 1302 may be formed by conducting a crystallization step through heating at the temperature higher than the upper temperature limit of a glass substrate. Typically, a quartz substrate is used as the insulating substrate 101 and an amorphous or microcrystalline semiconductor is heated at 700° C. or more to form the semiconductor layer 1302. As a result, a semiconductor with superior crystallinity can be formed. Therefore, a thin film transistor which is superior in response speed, mobility, and the like and which is capable of high-speed operation can be provided.

Moreover, the semiconductor layer 1302 may be formed with a single-crystal semiconductor. Such a semiconductor layer may be formed using a SIMOX (Separation by Implanted Oxygen) substrate in which a first single crystal semiconductor layer, an insulating layer, and a second single crystal semiconductor layer are stacked in order, in such a way that after a transistor using the first single crystal semiconductor layer as a channel portion is manufactured, the second single crystal semiconductor layer is etched away, and then the insulating layer is attached onto the insulating substrate 101. As the etching method of the second single crystal semiconductor layer, polishing using a grinding polishing device such as a grind stone, dry etching or wet etching using etchant, or a combination of a grinding polishing device and etchant may be employed. As the etchant, in the case of wet etching, a mixed solution in which fluorinated acid is diluted with water or ammonium fluoride; a mixed solution of fluorinated acid and nitric acid; a mixed solution of fluorinated acid, nitric acid, and acetic acid; a mixed solution of hydrogen peroxide and sulfuric acid; a mixed solution of hydrogen peroxide and ammonium water; a mixed solution of hydrogen peroxide and hydrochloric acid; or the like is used. In the case of dry etching, gas including molecules or atoms of halogen such as fluorine, or gas including oxygen is used. It is preferable to use gas or liquid including halogen fluoride or a halogen compound. For example, chlorine trifluoride ($ClF_3$) is preferably used as the gas including halogen fluoride.

Since such a transistor in which the semiconductor layer is formed with a single crystal semiconductor has high response speed, mobility, and the like, a transistor capable of high-speed operation can be provided. Moreover, since the transistor has low variation in its characteristic, a wireless chip in which high reliability has been achieved can be provided.

A gate electrode 1304 can be formed with metal or a poly-crystalline semiconductor doped with an impurity imparting one conductivity type. In the case of using metal, tungsten (W), molybdenum (Mo), titanium (Ti), tantalum (Ta), aluminum (Al), or the like can be used. Moreover, metal nitride obtained by nitriding the above metal can also be used. Alternatively, a structure in which a first layer including the metal nitride and a second layer including the metal are stacked may be employed. In the case of stacking layers, an end of the first layer may be provided outer than an end of the second layer. By forming the first layer with metal nitride, the first layer can serve as metal barrier. In other words, the first layer can prevent the metal of the second layer from dispersing into the insulating layer 1303 and the semiconductor layer 1302 under the insulating layer 1303.

A sidewall (side wall spacer) 1308 is formed at a side surface of the gate electrode 1304. The sidewall can be formed by forming an insulating layer including silicon oxide over a substrate by a CVD method and anisotropically etching the insulating layer by an RIE (Reactive Ion Etching) method.

The transistor formed by combining the semiconductor layer 1302, the insulating layer 1303, the gate electrode 1304, and the like can have any structure such as a single drain structure, an LDD (Lightly Doped Drain) structure, or a gate-overlapped drain structure. Here, a thin film transistor having an LDD structure is shown in which a low-concentration impurity region 1310 is formed in a part of the semiconductor layer that overlaps the sidewall. Moreover, a single gate structure, a multi-gate structure in which transistors to which gate voltage having the same electric potential equally is applied are serially connected, or a dual gate structure sandwiching the semiconductor layer with the gate electrodes on its upper and lower sides can be employed.

The insulating layer 1306 is formed with an inorganic insulating material such as silicon oxide or silicon oxynitride, or an organic insulating material such as an acrylic resin or a polyimide resin. In the case of forming the insulating layer by a coating method such as spin coating or a roll coater, after applying an insulating film material dissolved in an organic solvent, a heat treatment is performed thereto, thereby forming the insulating layer with silicon oxide. For example, after forming a film including a siloxane bond by a coating method, a heat treatment is conducted at 200 to 400° C., thereby forming the insulating layer with silicon oxide. By using an insulating layer formed by a coating method or an insulating layer which has been flattened by reflow as the insulating layer 1306, it is possible to prevent wirings to be formed over the layer from being broken. Moreover, the insulating layer can also be used effectively when forming a multilayer wiring.

A wiring 1307 formed over the insulating layer 1306 can be provided so as to intersect with a wiring to be formed with the same layer as the gate electrode 1304 and has a multilayer wiring structure. The multilayer wiring structure can be obtained by forming wirings over a plurality of stacked insulating layers which have the similar function to the insulating layer 1306. The wiring 1307 preferably has a combination of a low-resistant material such as aluminum and metal barrier using a metal material having a high melting point such as titanium (Ti) or molybdenum (Mo). For example, a multilayer structure including titanium (Ti) and aluminum (Al), a multilayer structure including molybdenum (Mo) and aluminum (Al), and the like are given.

Figure 18B:
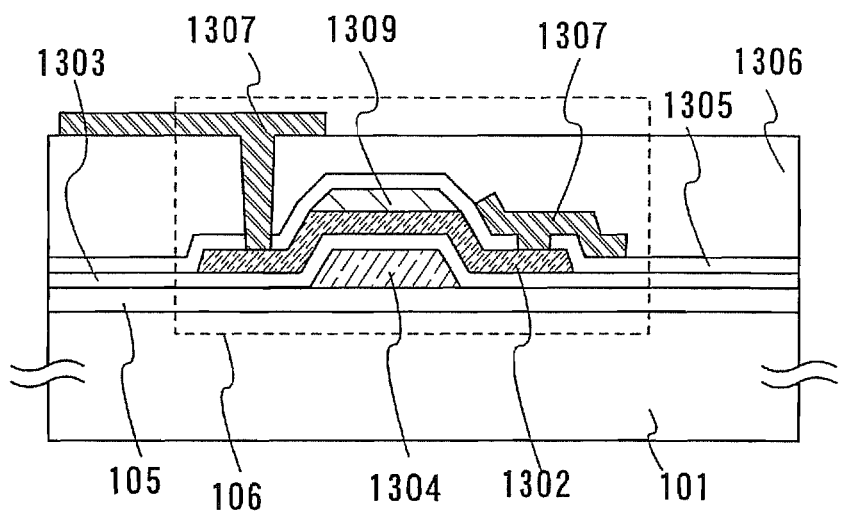

FIG. 18B shows an example of a bottom-gate thin film transistor. The insulating layer 105 is formed over the insulating substrate 101, and the thin film transistor 106 is provided over the insulating layer 105. In the thin film transistor 106, the gate electrode 1304, the insulating layer 1303 serving as a gate insulating layer, the semiconductor layer 1302, a channel protective layer 1309, the insulating layer 1305 serving as a protective layer, and the insulating layer 1306 serving as an interlayer insulating layer are provided. Moreover, an insulating layer serving as a protective layer may be formed thereover. The wiring 1307 can be formed over the insulating layer 1305 or the insulating layer 1306. In the case of forming the bottom-gate thin film transistor, the insulating layer 105 is not necessarily formed.

The interlayer insulating layer 108 shown in FIG. 1A is formed by a similar method to the insulating layer 1306. The connection terminal 107 is formed by a similar method to the wiring 1307. On the uppermost surface of the wiring, a layer may be formed with one or plural elements selected from gold, silver, copper, palladium, and platinum by a printing method, a plating method, a sputtering method, or the like.

The anisotropic conductive adhesive 104 is an adhesive organic resin in which conductive particles 109 (each having a grain diameter of approximately several nm to several μm) are dispersed. An epoxy resin, a phenol resin, or the like is given as the organic resin. The conductive particle is formed with one or plural elements selected from gold, silver, copper, palladium, and platinum, or may be a particle having a multilayer structure of these elements. Further, a conductive particle formed with a resin whose surface is coated with a thin film which is formed with one or plural metals selected from gold, silver, copper, palladium, and platinum may be used.

Instead of the anisotropic conductive adhesive 104, a conductive layer formed by curing conductive paste may be used. As a typical example of the conductive layer formed by curing the conductive paste, alloy including plural elements selected from tin (Sn), silver (Ag), bismuth (Bi), copper (Cu), indium (In), nickel (Ni), antimony (Sb), and zinc (Zn) is given.

The antenna 103 has a dielectric layer 110, a first conductive layer 111 formed on one surface of the dielectric layer 110, a second conductive layer 112 which is formed on another surface of the dielectric layer 110 and which opposes to the first conductive layer 111 through the dielectric layer 110, and a power feeding layer 113. The antenna having such a structure is hereinafter referred to as a patch antenna. The first conductive layer 111 serves as a radiating electrode. The second conductive layer 112 serves as a ground contact body. The power feeding layer 113 is provided so as not to contact the first conductive layer 111 and the second conductive layer 112. Power is fed from the antenna to a circuit including the thin film transistor or from the circuit including the thin film transistor to the antenna, through the power feeding layer 113.

In this embodiment mode, the connection terminal 107 is electrically connected to the power feeding layer 113 through the conductive particle 109 included in the anisotropic conductive adhesive 104. Although not shown, a ground electrode of the circuit including the thin film transistor is electrically connected to the second conductive layer 112 of the antenna 103 through the conductive particle 109.

Here, the patch antenna is described.

The dielectric layer 110 of the patch antenna can be formed with ceramic, an organic resin, a mixture of ceramic and an organic resin, or the like. As a typical example of ceramic, alumina, glass, forsterite, or the like is given. Moreover, plural ceramics may be mixed. In order to obtain high dielectric constant, it is preferable to form the dielectric layer 110 with a ferroelectric material. As a typical example of the ferroelectric material, barium titanate ($BaTiO_3$), lead titanate ($PbTiO_3$), strontium titanate ($SrTiO_3$), lead zirconate ($PbZrO_3$), lithium niobate ($LiNbO_3$), zircon lead titanate (PZT), or the like is given. Moreover, a mixture of plural ferroelectric materials may be used.

As the organic resin which can be used for the dielectric layer 110, a thermosetting resin or a thermoplastic resin is appropriately used. As a typical example of the organic resin, a resin material such as an epoxy resin, a phenol resin, a polybutadiene resin, a bismaleimide triazine resin, vinylbenzyl, polyfumarate, a fluorine resin, or the like can be used. Moreover, a mixture of plural organic resin materials may also be used.

In the case of forming the dielectric layer 110 with a mixture of ceramic and an organic resin, it is preferable to form the dielectric layer 110 in such a way that ceramic particles are dispersed in the organic resin. Here, the content of the ceramic particles in the dielectric layer 110 is preferably 20 vol % or more and 60 vol % or less. Moreover, the diameter of the ceramic particle preferably ranges from 1 to 50 μm.

The relative permittivity of the dielectric layer 110 preferably ranges from 2.6 to 150, more preferably 2.6 to 40. By using a ferroelectric material having a high relative permittivity, it is possible to decrease the capacitance of the patch antenna.

The first conductive layer 111, the second conductive layer 112, and the power feeding layer 113 of the patch antenna can be formed with metal selected from gold, silver, copper, palladium, platinum, and aluminum; alloy including the metal; or the like. The first conductive layer 111, the second conductive layer 112, and the power feeding layer 113 of the patch antenna can be formed by a printing method or a plating method. Each of these conductive layers can be formed by forming a conductive film over the dielectric layer by an evaporation method, a sputtering method, or the like and partially etching the conductive film.

The patch antenna is preferably a rectangular flat plate with a size of 12 mm×12 mm×4 mm, 7 mm×7 mm×3 mm, or 7 mm×7 mm×1.5 mm; however, the size is not limited to these. A circular flat plate can also be used.

The patch antenna to be used as the antenna 103 of this embodiment mode is described with reference to FIGS. 7A to 7D.

Figure 7A:
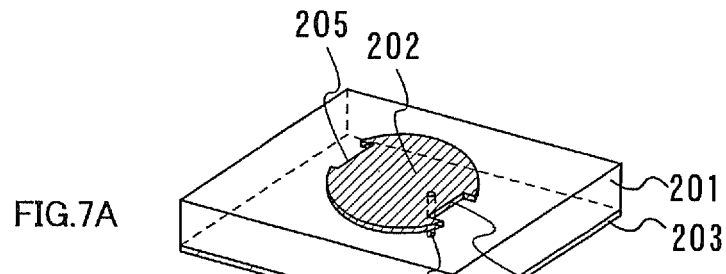
FIGS. 7A to 7D are perspective views showing patch antennas applicable to the present invention.

FIG. 7A shows a patch antenna having a first conductive layer 202 serving as a radiating electrode, a dielectric layer 201, a second conductive layer 203 serving as a ground contact body, and a power feeding point 204. The patch antenna is a circularly-polarized wave antenna if the first conductive layer 202 serving as a radiating electrode is circular and a degenerate separation element 205 exists in two regions which are symmetric about a point. Meanwhile, if the first conductive layer 202 is circular, the patch antenna is a linearly-polarized wave antenna.

Figure 7B:
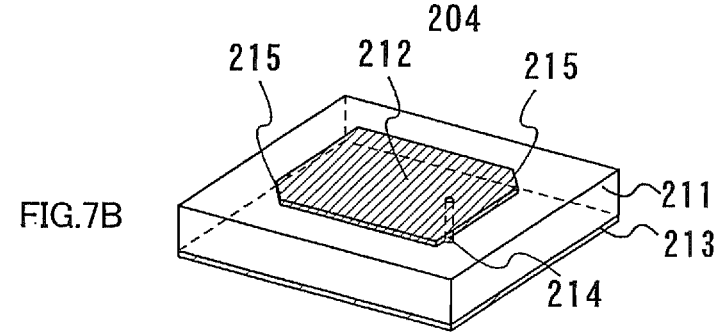

FIG. 7B shows a patch antenna having a first conductive layer 212 serving as a radiating electrode, a dielectric layer 211, a second conductive layer 213 serving as a ground contact body, and a power feeding point 214. The patch antenna is a circularly-polarized wave antenna if the first conductive layer 212 serving as a radiating electrode is rectangular and a degenerate separation element 215 exists in two regions which are symmetric about a point. Meanwhile, if the first conductive layer 212 is rectangular, the patch antenna is a linearly-polarized wave antenna.

Figure 7C:
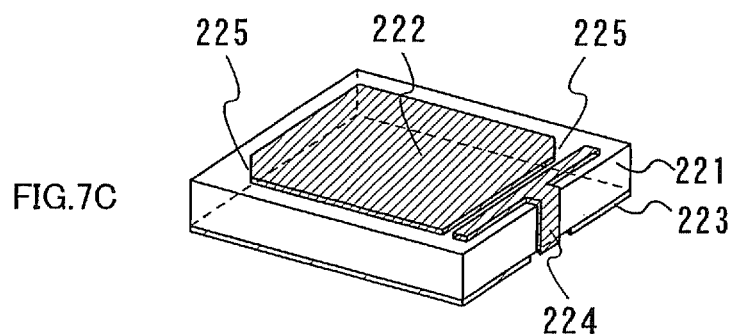

FIG. 7C shows a patch antenna having a first conductive layer 222 serving as a radiating electrode, a dielectric layer 221, a second conductive layer 223 serving as a ground contact body, and a power feeding layer 224. The first conductive layer 222 serving as a radiating electrode is rectangular, and has a degenerate separation element 225 at two angle portions which are symmetric about a point. The patch antenna is a circularly-polarized wave antenna if the first conductive layer 222 serving as a radiating electrode is rectangular and the degenerate separation element 225 exists in two regions which are symmetric about a point. Meanwhile, if the first conductive layer 222 is rectangular, the patch antenna is a linearly-polarized wave antenna. The first conductive layer 222 serving as a radiating electrode and the power feeding layer 224 are capacitance-coupled through gap. Moreover, since the power feeding layer 224 is formed at a side surface of the dielectric layer, surface mount is possible.

Since the patch antennas shown in FIGS. 7A to 7C are provided with the second conductive layers 203, 213, and 223 serving as ground contact bodies on one surfaces of the dielectric layers 201, 211, and 221, the directivity exists on the first conductive layers 202, 212, and 222 side.

Figure 7D:
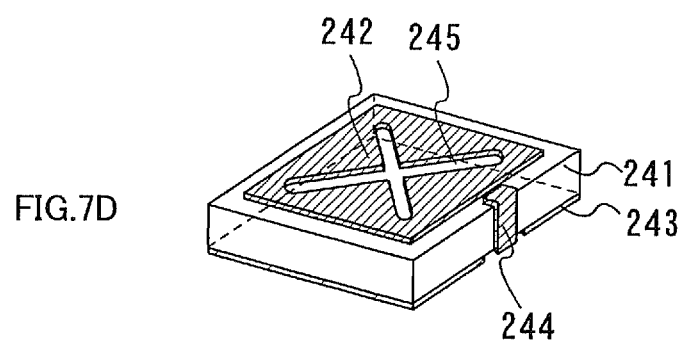

FIG. 7D shows a patch antenna having a first conductive layer 242 serving as a radiating electrode, a dielectric layer 241, a second conductive layer 243 serving as a ground contact body, and a power feeding layer 244. In the first conductive layer 242, orthogonal slits are formed on diagonal lines. In other words, a crisscross notch is provided. Therefore, the dielectric layer 241 is exposed in a crisscross manner. The first conductive layer 242 serving as a radiating electrode and the power feeding layer 244 are capacitance-coupled through a gap. As a typical example of the patch antenna having such a shape, CABPB 1240, CABPB 0730, and CABPB 0715 (manufactured by TDK Corporation) are given. Moreover, since the power feeding layer 244 is formed at a side surface of the dielectric layer, surface mount is possible. Since the patch antenna having such a structure has non-directivity by the orthogonal slits of the radiating electrode, a place to be mounted on and an angle to be disposed at do not need to be selected. Thus, the degree of freedom in designing electronic appliances can be widened.

A known patch antenna other than the patch antennas shown in FIGS. 7A to 7D can also be used.

By using a patch antenna, it is possible to send and receive the followings: GPS (Global Positioning System (1.5 GHz)), satellite digital broadcast (2.6 GHz), PAN (Personal Area Network) such as wireless LAN (Local Area Network) (2.4 GHz, 5.2 GHz), a wireless communication technology for connecting information appliances (Bluetooth (registered trademark) (2.4 GHz)), or UWB (Ultra Wide Band) (3 to 10 GHz), third-generation data communication, packet communication, and the like.

As shown in FIG. 1B, plural layers having thin film transistors may be stacked over an insulating substrate. Specifically, a second layer 122 having a thin film transistor is formed over a first layer 121 having a thin film transistor. A third layer 123 having a thin film transistor is formed over the second layer 122 having a thin film transistor. In the third layer 123 having a thin film transistor, an insulating layer 127 is formed over a thin film transistor. Further, on a surface of the insulating layer 127, a connection terminal 126 connected to any one of the thin film transistors in the first layer having a thin film transistor to the third layer having a thin film transistor is formed.

In the first layer 121 having a thin film transistor, a first insulating layer 124 is formed over a thin film transistor. In the first insulating layer 124, a thin film transistor in the first layer 121 having a thin film transistor is electrically disconnected from a thin film transistor in the second layer 122 having a thin film transistor. Further, in the second layer 122 having a thin film transistor, a second insulating layer 125 is formed over a thin film transistor. In the second insulating layer 125, a thin film transistor in the second layer 122 having a thin film transistor is electrically disconnected from a thin film transistor in the third layer 123 having a thin film transistor. In the third layer 123 having a thin film transistor, a third insulating layer 127 is formed over a thin film transistor. In the third insulating layer 127, a thin film transistor in the third layer 123 having a thin film transistor is electrically disconnected from the connection terminal.

A compact and multi-functional wireless chip can be obtained by forming a processor unit, a power source circuit, a clock generating circuit, a data modulation/demodulation circuit, a control circuit, an interface circuit, a storage circuit, a detection circuit, or the like, by using each of the first layer having a thin film transistor to the third layer having a thin film transistor.

The layer 120 having a thin film transistor is shown using the first layer having a thin film transistor to the third layer having a thin film transistor in FIG. 1B; however, the present invention is not limited to this. The layer 120 having a thin film transistor may include two layers having thin film transistors. Further, the layer 120 having a thin film transistor may include four or more layers having thin film transistors.

Figure 9A:
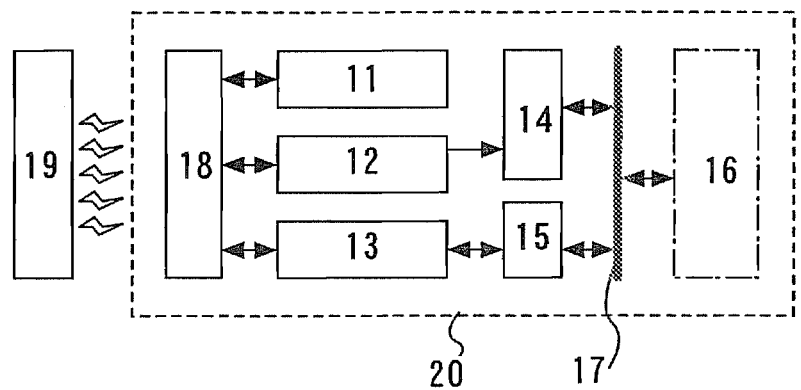
FIGS. 9A to 9C show a wireless chip of the present invention.

Here, a structure of a wireless chip of the present invention is described with reference to FIGS. 9A to 9C and FIG. 10. As shown in FIG. 9A, a wireless chip 20 of the present invention has a function to send and receive data wirelessly, and also has a power source circuit 11, a clock generating circuit 12, a data modulation/demodulation circuit 13, a control circuit 14 which controls another circuit, an interface circuit 15, a storage circuit 16, a bus 17, and an antenna 18.

Figure 9B:
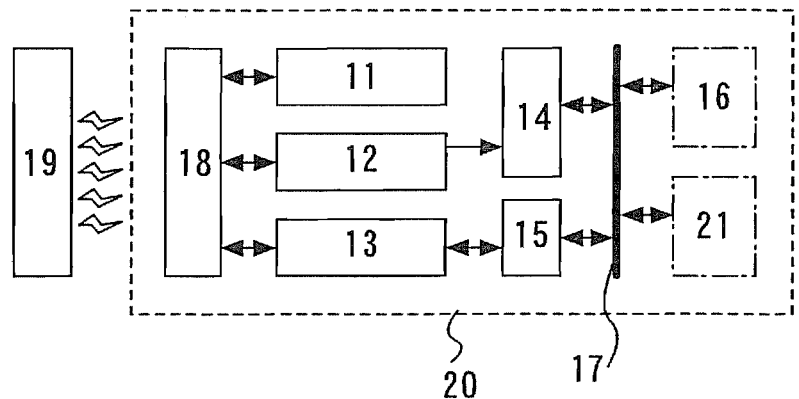

Further, as shown in FIG. 9B, the wireless chip 20 of the present invention has a function to send and receive data wirelessly, and may have a microprocessor (CPU) 21, in addition to the power source circuit 11, the clock generating circuit 12, the data modulation/demodulation circuit 13, the control circuit 14 which controls another circuit, the interface circuit 15, the storage circuit 16, the bus 17, and the antenna 18.

Figure 9C:
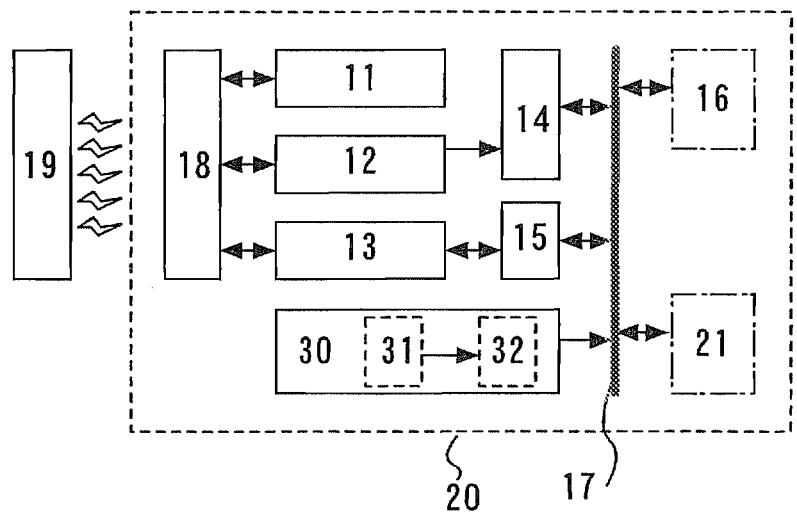

Moreover, as shown in FIG. 9C, the wireless chip 20 of the present invention has a function to send and receive data wirelessly, and may have a detection portion 30 including a detection element 31 and a detection control circuit 32, in addition to the power source circuit 11, the clock generating circuit 12, the data modulation/demodulation circuit 13, the control circuit 14 which controls another circuit, the interface circuit 15, the storage circuit 16, the bus 17, the antenna 18, and the central processing unit 21.

In the wireless chip of the present invention, the detection portion 30 including the detection element 31 and the detection control circuit 32 and the like are formed in addition to the power source circuit 11, the clock generating circuit 12, the data modulation/demodulation circuit 13, the control circuit 14 which controls another circuit, the interface circuit 15, the storage circuit 16, the bus 17, the antenna 18, and the central processing unit 21, by using the layers having thin film transistors.

The power source circuit 11 is a circuit generating various power sources to be supplied to the respective circuits in the wireless chip 20 based on an alternating signal inputted from the antenna 18. The clock generating circuit 12 is a circuit generating various clock signals to be supplied to the respective circuits in the wireless chip 20 based on an alternating signal inputted from the antenna 18. The data modulation/demodulation circuit 13 has a function to modulate/demodulate data to be sent to or received from a reader/writer 19. The control circuit 14 has a function to control the storage circuit 16. The antenna 18 has a function to send and receive an electric field or an electric wave to and from the reader/writer 19. The reader/writer 19 has a function to exchange data with the wireless chip, control the wireless chip, and control the process of the data sent to or received from the wireless chip. The wireless chip is not limited to the above structure, and for example, another element such as a limiter circuit of power source voltage or hardware only for processing codes may be added.

The storage circuit 16 has one or plural elements selected from a DRAM, an SRAM, an FeRAM, a mask ROM, a PROM, an EPROM, an EEPROM, a flash memory, and an organic memory.

An organic memory has a layer containing an organic compound between a pair of electrodes. Moreover, an organic memory has, between a pair of electrodes, a layer in which an organic compound is mixed with an inorganic compound. As a typical example of the organic compound, a substance whose shape, conductivity, or crystal condition changes by an electric action or light irradiation is used. Typically, a conjugate polymer doped with a compound generating acid by absorbing light (photoacid generator), an organic compound having a high hole-transporting property, or an organic compound having a high electron-transporting property can be used.

In the case of providing a mixed layer of an organic compound and an inorganic compound between a pair of electrodes, it is preferable to mix an organic compound having a high hole-transporting property and an inorganic compound which is easy to receive electrons. Moreover, it is preferable to mix an organic compound having a high electron-transporting property and an inorganic compound which is easy to donate electrons. By having such structures, many hole carriers or electron carriers generate in an organic compound originally having almost no carriers intrinsically, so that the organic compound exhibits an extremely high hole-injecting/transporting property or electron-injecting/transporting property.

Since the size reduction, the decrease in film thickness, as well as the increase in capacitance can be achieved simultaneously in the organic memory, the wireless chip can be compact and lightweight by forming the storage circuit 16 with the organic memory.

A mask ROM can be formed at the same time as the thin film transistor. The mask ROM is formed with plural transistors. At this time, data can be written by opening or not opening a contact hole for a wiring which connects to, for example, a drain region of the transistor. For example, data (information) of 1 (ON) when the contact hole is opened and data (information) of 0 (OFF) when the contact hole is not opened can be written in a memory cell.

For example, a part of a photoresist formed over the interlayer insulating layer 108 over the thin film transistor 106 shown in FIG. 1A where the contact hole is to be provided is irradiated with an electron beam or a laser, before or after a step of Light-exposing the photoresist through a reticle (photomask) using a light-exposure apparatus such as a stepper. After that, the steps of developing, etching, peeling the photoresist, and the like are conducted as usual to form a wiring. This makes it possible to independently form a pattern where the contact hole is provided and a pattern where the contact hole is not provided only by selecting regions to be irradiated with the electron beam or the laser, without changing the reticle (photomask). In other words, by selecting the region to be irradiated with the electron beam or the laser, a mask ROM in which different data are written for each of the semiconductor devices at the production can be manufactured.

An UID (Unique Identifier) and the like for each semiconductor device can be manufactured by using such a mask ROM.

Figure 10:
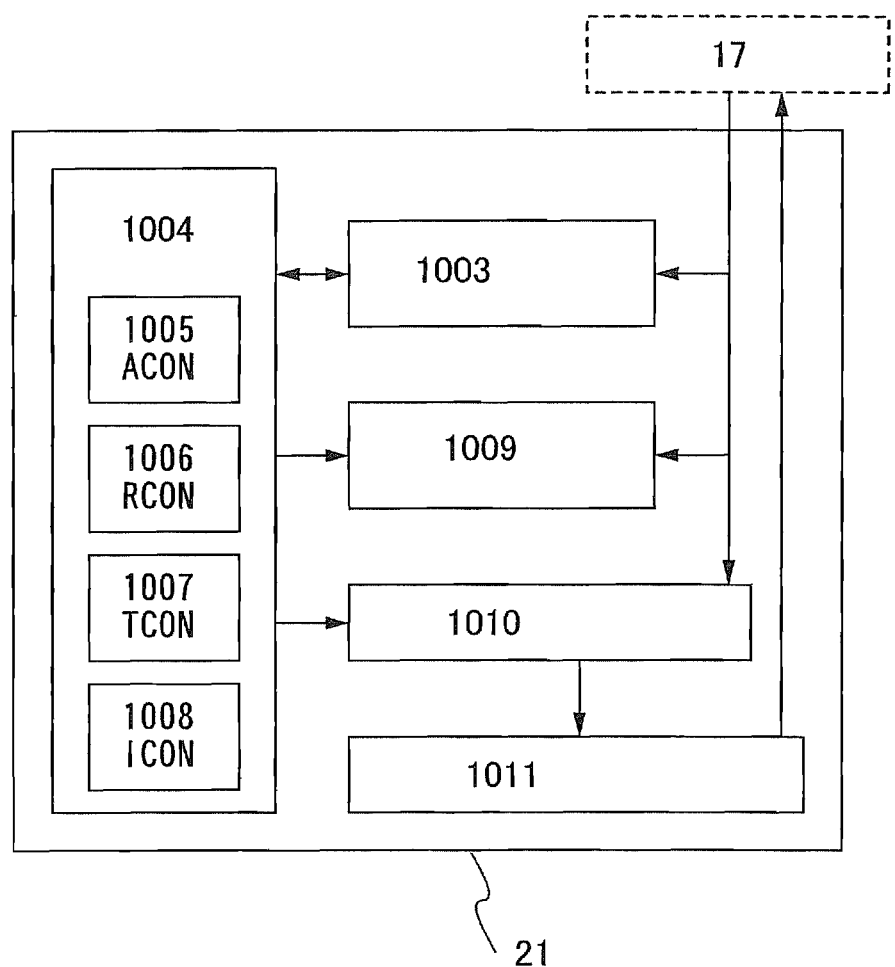
FIG. 10 shows a central processing unit applicable to the present invention.

Here, a structure of the central processing unit 21 is described with reference to a block diagram of FIG. 10.

First, a signal is inputted in the bus 17, and then the signal is decoded in an analysis circuit 1003 (also referred to as an instruction decoder), and the decoded signal is inputted into a control signal generating circuit 1004 (CPU timing controller). Upon the input of the signal, a control signal is outputted from the control signal generating circuit 1004 to an arithmetic circuit (hereinafter referred to as an ALU 1009) and a storage circuit (hereinafter referred to as a register 1010).

The control signal generating circuit 1004 includes an ALU controller (hereinafter referred to as ACON) 1005 for controlling the ALU 1009, a circuit (hereinafter referred to as RCON) 1006 for controlling the register 1010, a timing controller (hereinafter referred to as TCON) 1007 for controlling timing, and an interrupt controller (hereinafter referred to as ICON) 1008 for controlling interruption.

Meanwhile, after a process signal is inputted into the bus 17, the signal is outputted to the ALU 1009 and the register 1010. Then, a process based on the control signal inputted from the control signal generating circuit 1004 (such as a memory read cycle, a memory write cycle, an I/O read cycle, an I/O write cycle, or the like) is conducted.

The register 1010 includes a general-purpose register, a stack pointer (SP), a program counter (PC), and the like.

An address controller 1011 outputs a 16-bit address to the bus 17.

The structure of the central process unit shown in this embodiment does not limit the structure of the present invention. A structure of a known central process unit other than the above structures may also be employed.

The detection portion 30 can detect temperature, pressure, flow rate, light, magnetism, acoustic wave, acceleration, humidity, gas constituent, liquid constituent, and other characteristics by a physical or chemical means. Moreover, the detection portion 30 has the detection element 31 for detecting a physical amount or a chemical amount and the detection control circuit 32 for converting the physical amount or the chemical amount detected by the detection element 31 into an appropriate signal such as an electric signal. As the detection element 31, it is possible to use a resistor element, a capacitance-coupled element, an inductively-coupled element, a photoelectromotive element, a photoelectric conversion element, a thermoelectromotive element, a transistor, a thermistor, a diode, a piezo element, an electrostatic capacitance element, a piezoelectric element, or the like. The number of detection portions 30 may be more than one and, in such a case, it is possible to detect a plurality of physical amounts or chemical amounts simultaneously.

The physical amount described here means temperature, pressure, flow rate, light, magnetism, acoustic wave, acceleration, humidity, and the like, while the chemical amount means a chemical substance such as a gas constituent or a liquid constituent like ions, or the like. In addition, an organic compound such as a particular biological substance included in blood, sweat, urine, or the like (for example, blood-sugar level in the blood) is also included. In particular, in the case of detecting the chemical amount, since a particular substance needs to be selectively detected, a substance which selectively reacts with the substance to be detected is provided in advance in the detection element 31. For example, in the case of detecting a biological substance, it is preferable to fix, in a polymer or the like, enzyme, a resistor molecule, a microbial cell, or the like which selectively reacts with the biological substance to be detected by the detection element 31.

At the communication between the reader/writer and the wireless chip, it is possible to detect temperature, pressure, flow rate, light, magnetism, acoustic wave, acceleration, humidity, gas constituent, liquid constituent, and other characteristics, by using the detection portion 30. A film-like secondary battery may be used for the wireless chip. As a typical example of the film-like secondary battery, a thin secondary battery having gel to which an electrolysis solution has penetrated can be used. In this case, even when the communication is not made with the reader/writer, the above characteristics can be detected by using the detection portion 30.

In the wireless chip of the present embodiment mode, the antenna and the layer having the thin film transistor formed over the insulating substrate can be formed to have almost the same dimension. The insulating substrate serves as a protector for the layer having a thin film transistor as well as a protector for the antenna. Therefore, the mechanical strength of the wireless chip increases.

Embodiment Mode 2

Figure 2:
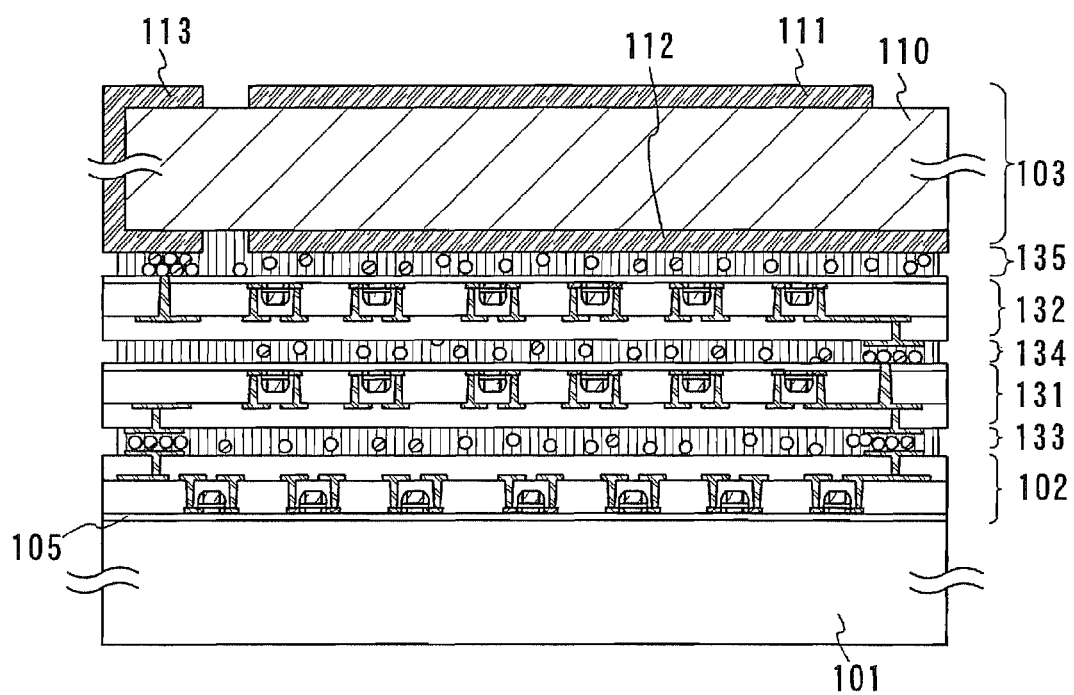
FIG. 2 is a cross-sectional view showing a wireless chip of the present invention.

An embodiment mode of a wireless chip of the present invention is shown in FIG. 2. FIG. 2 is a cross-sectional view of a wireless chip. In this embodiment mode, a structure of a wireless chip which has a patch antenna and plural layers having thin film transistors wherein the layers are fixed to each other by an anisotropic conductive adhesive is described.

In a wireless chip of this embodiment mode, a first layer 102 having a thin film transistor is formed over an insulating substrate 101 similarly to Embodiment Mode 1. Further, the first layer 102 having a thin film transistor and a second layer 131 having a thin film transistor are fixed to each other by an anisotropic conductive adhesive 133.

A first connection terminal formed on the surface of the first layer 102 having a thin film transistor is electrically connected to a second connection terminal formed on the surface of the second layer having a thin film transistor through conductive particles dispersed in the anisotropic conductive adhesive 133.

After forming the second layer 131 having a thin film transistor over a peeling layer which has been provided over a substrate, the second layer 131 having a thin film transistor is peeled from the peeling layer, and the second layer 131 is attached over the first layer 102 having a thin film transistor through an anisotropic conductive adhesive 133. As the peeling method, the following methods can be used appropriately: (1) a metal oxide film is provided as a peeling layer between a substrate having high heat resistance and the second layer having a thin film transistor, and the metal oxide film is weaken by crystallization, thereby peeling the second layer having a thin film transistor; (2) an amorphous silicon film containing hydrogen is provided as a peeling layer between a substrate having heat resistance and the second layer having a thin film transistor, and the amorphous silicon film is removed by laser irradiation or etching, thereby peeling the second layer having a thin film transistor; (3) a substrate having high heat resistance (a glass substrate, a silicon substrate, or the like) where the second layer having a thin film transistor has been formed is mechanically removed or etched away with the use of a solution or halogen fluoride gas such as $NF_3$, $BrF_3$, or $ClF_3$; (4) a metal layer and a metal oxide film are provided between a substrate having high heat resistance and the second layer having a thin film transistor, the metal oxide film is weakened by crystallization, a part of the metal layer is etched away with the use of a solution or halogen fluoride gas such as $NF_3$, $BrF_3$, or $ClF_3$, and then the weakened metal oxide film is physically peeled; (5) a peeling layer and a metal oxide film are provided between a substrate having high heat resistance and an insulating layer, the second layer 131 having a thin film transistor is formed over the insulating layer while the metal oxide film is weakened, a part of the insulating layer of the second layer 131 having a thin film transistor is irradiated with laser light to form an opening portion (an opening portion for exposing a part of the peeling layer), a base material is attached onto the second layer 131 having a thin film transistor, and the second layer 131 having a thin film transistor is physically peeled from the substrate using the weakened metal oxide film; and the like.

Similarly to the first layer 102 having a thin film transistor and the second layer 131 having a thin film transistor, the second layer 131 having a thin film transistor and the third layer 132 having a thin film transistor are fixed to each other by an anisotropic conductive adhesive 134.

A third connection terminal formed on the surface of the second layer 131 having a thin film transistor is electrically connected to a fourth connection terminal formed on the surface of the third layer 132 having a thin film transistor, through conductive particles dispersed in the anisotropic conductive adhesive 134.

A compact and multi-functional wireless chip can be formed by forming any one of a processor unit, a power source circuit, a clock generating circuit, a data modulation/demodulation circuit, a control circuit, an interface circuit, a storage circuit, a detection circuit, and the like with the first layer 102 having a thin film transistor to the third layer 132 having a thin film transistor.

A fifth connection terminal formed on the surface of the third layer 132 having a thin film transistor is electrically connected to the antenna 103 through conductive particles in the anisotropic conductive adhesive. Although not shown here, a ground contact electrode of the circuit formed with the thin film transistor is electrically connected to the second conductive layer 112 of the antenna through the conductive particle similarly. Instead of an anisotropic conductive adhesive 135, a conductive layer formed by curing conductive paste may be used.

Although a wireless chip is shown in which the first layer having a thin film transistor to the third layer having a thin film transistor are fixed to each other by the anisotropic conductive adhesive, the present invention is not limited to this, and two layers having thin film transistors may be used. Moreover, four or more layers having thin film transistors may be used.

Further, this embodiment mode may be appropriately combined with Embodiment Mode 1.

In the wireless chip of the present embodiment mode, the antenna and the layer having a thin film transistor fowled over the insulating substrate can be formed to have almost the same dimension. The insulating substrate serves as a protector for the layer having a thin film transistor as well as a protector for the antenna. Therefore, the mechanical strength of the wireless chip increases.

Moreover, since the plural layers having thin film transistors are fixed to the patch antenna in the wireless chip of this embodiment mode, the wireless chip has composite functions.

Embodiment Mode 3

Figure 3:
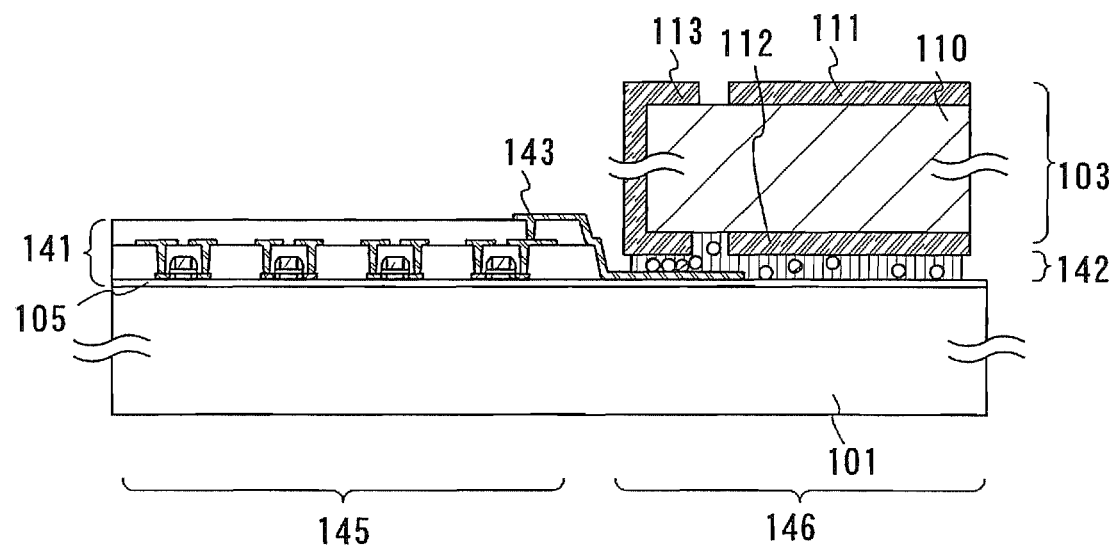
FIG. 3 is a cross-sectional view showing a wireless chip of the present invention.

An embodiment mode of a wireless chip of the present invention will be described with reference to FIG. 3. FIG. 3 is a cross-sectional view of a wireless chip. This embodiment mode will describe a structure of a wireless chip in which a layer having a thin film transistor and a patch antenna are provided in different regions over an insulating substrate.

Over the insulating substrate 101, a layer 141 having a thin film transistor is formed in a first region 145. On a surface of the layer 141 having a thin film transistor, a connection terminal 143 is formed. The layer 141 having a thin film transistor can be formed similarly to the first layer 102 having a thin film transistor in Embodiment Mode 1. Further, as shown in FIG. 3, parts of the thin film transistor and the insulating layer formed thereover that are in a second region 146 may be removed.

The antenna 103 is fixed onto the second region 146 by an anisotropic conductive adhesive 142. The connection terminal 143 of the layer 141 having a thin film transistor is formed so as to overlap both of the first region 145 and the second region 146. The power feeding layer 113 of the antenna 103 is electrically connected to the connection terminal 143 of the layer 141 having a thin film transistor through conductive particles dispersed in the anisotropic conductive adhesive 142. Although not shown, a ground contact electrode in a circuit formed with a thin film transistor is electrically connected to the second conductive layer 112 of the antenna through the conductive particles similarly. Instead of the anisotropic conductive adhesive 142, a conductive layer formed by curing conductive paste may be used.

In this embodiment mode, the layer having a thin film transistor has a single-layer structure; however, the layer having a thin film transistor can have a multilayer structure as shown in Embodiment Mode 2. Further, as shown in Embodiment Mode 3, plural layers having thin film transistors may be fixed to each other by an anisotropic conductive adhesive.

Since the plural layers having thin film transistors are fixed to the patch antenna in the wireless chip of this embodiment mode, the wireless chip has composite functions.

Embodiment Mode 4

Figure 4:
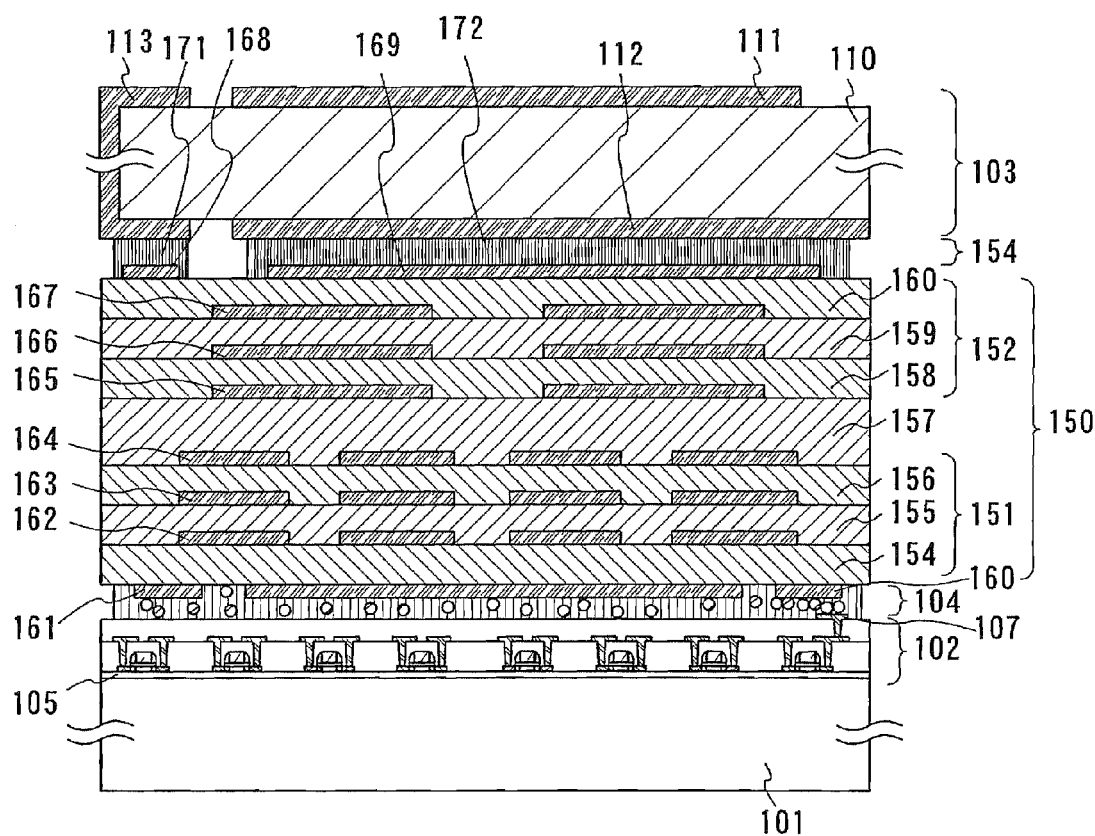
FIG. 4 is a cross-sectional view showing a wireless chip of the present invention.

An embodiment mode of a wireless chip of the present invention will be described with reference to FIG. 4. FIG. 4 is a cross-sectional view of a wireless chip. This embodiment mode will describe a structure of a wireless chip in which a layer having a thin film transistor, a passive element, and a patch antenna which are formed over an insulating substrate are fixed to each other by an anisotropic conductive adhesive, a conductive layer, or the like.

As shown in Embodiment Mode 1, the layer 102 having a thin film transistor is formed over the insulating substrate 101. The layer 102 having a thin film transistor and the passive element 150 are fixed to each other by the anisotropic conductive adhesive 104. Here, the passive element 150 is shown by a first passive element 151 and a second passive element 152. Moreover, the connection terminal 107 exposed at the surface of the layer 102 having a thin film transistor is electrically connected to a first connection terminal 161 of the passive element 150 by conductive particles in the anisotropic conductive adhesive 104. A conductive layer formed by curing conductive paste may be used instead of the anisotropic conductive adhesive 104.

The passive element 150 and the antenna 103 are fixed to each other by conductive layers 171 and 172. The power feeding layer 113 of the antenna 103, the second connection terminal 168 of the passive element 150, the second conductive layer 112 serving as a ground contact body of the patch antenna, and the third connection terminal 169 of the passive element are respectively connected electrically through the conductive layers 171 and 172. The conductive layers 171 and 172 are formed by curing conductive paste. As a typical example of the conductive layer formed by curing conductive paste, alloy containing plural elements selected from tin (Sn), silver (Ag), bismuth (Bi), copper (Cu), indium (In), nickel (Ni), antimony (Sb), and zinc (Zn) is given.

The first passive element 151 includes one or more of a capacitor, an inductor, and a resistor by using insulating layers 154 to 157 and conductive layers 162 to 164 provided therebetween. Similarly, the second passive element 152 includes one or more of a capacitor, an inductor, and a resistor by using insulating layers 157 to 160 and the conductive layers 165 to 167 provided therebetween.

It is preferable that the relative permittivity of the insulating layers 154 to 160 of the first passive element 151 or the second passive element 152 range from 2.6 to 40. The conductive layers 162 to 167 are formed with metal having high conductivity such as gold, silver, copper, or aluminum or alloy including plural elements selected from these.

A method for forming the first passive element 151 and the second passive element 152 is hereinafter shown. Over ceramic including aluminum oxide and silicon oxide which has been formed in a sheet-like shape (which is a so-called green sheet) with a thickness of 10 to 150 μm, a conductive layer is formed with metal having high conductivity such as gold, silver, copper, or aluminum or alloy including plural elements selected from these metals by a printing method. If necessary, a through-hole may be formed in the green sheet and a plug may be formed by filling the through-hole with conductive paste. The green sheet may be formed by appropriately mixing ceramic, an organic resin, or the like which forms the dielectric layer 110 of the patch antenna shown in Embodiment Mode 1. A plurality of such green sheets where the conductive layer has been printed can be stacked and pressured while applying heat thereto, and then processed to have a predetermined size. After that, the insulating layer and the conductive layer can be baked at 800 to 1,300° C., thereby forming the first passive element 151 and the second passive element 152. Moreover, a conductive layer may be formed at a side surface of the insulating layer and connected to the conductive layers formed in the respective layers.

By combining plural passive elements such as a capacitor, an inductor, a resistor, and a wiring, it is possible to form an antenna front-end module including a condenser (capacitor), a diplexer, and a low pass filter; an isolator power amplifier module including an isolator, a coupler, an attenuator, and a power amplifier; a VCO (voltage control oscillator); a band pass filter (BPF); a multilayer filter; a balun transformer; a dielectric filter; a coupler; a resonator; and the like.

A power source circuit, a clock generating circuit, a data modulation/demodulation circuit, a control circuit for controlling another circuit, an interface circuit, a storage circuit, a bus, an antenna, a central processing unit, a detection portion including a detection element and a detection control circuit, and the like are formed using the layer having a thin film transistor and the passive element.

This embodiment mode can be appropriately combined with any one of Embodiment Modes 1 to 3.

The wireless chip of this embodiment mode includes an integrated circuit which is formed using a thin film transistor and the passive element formed with a thin film pattern. Therefore, since each circuit is formed using an element having an appropriate function, the wireless chip has composite functions. By mounting the wireless chip of the present invention onto a wiring substrate, the number of mount parts can be decreased. Thus, the dimension of the wiring substrate as well as the size of an electronic appliance having the wiring substrate can be reduced.

Embodiment Mode 5

Figure 5:
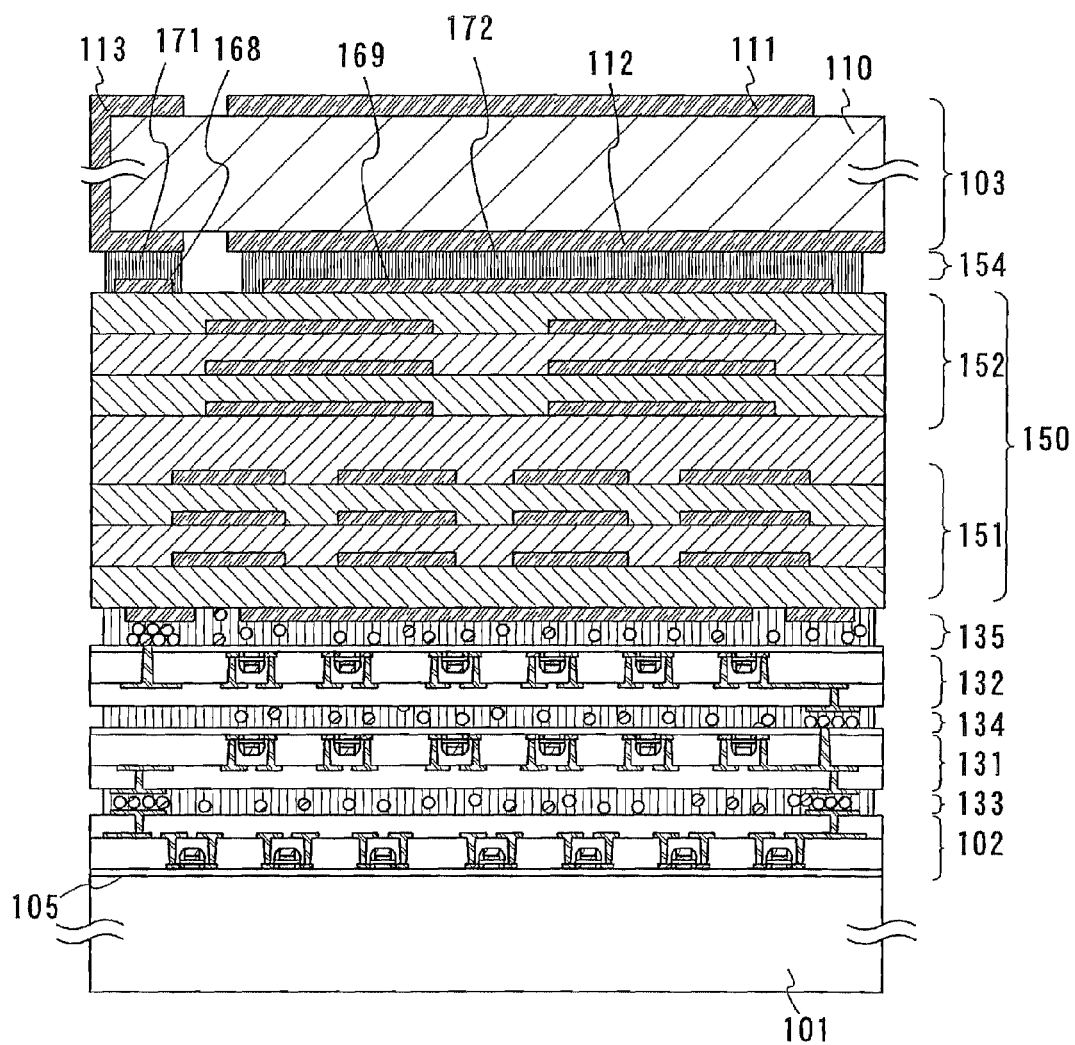
FIG. 5 is a cross-sectional view showing a wireless chip of the present invention.

An embodiment mode of a wireless chip of the present invention is shown in FIG. 5. FIG. 5 is a cross-sectional view of a wireless chip. This embodiment mode will describe a structure of a wireless chip in which plural layers having thin film transistors which are fixed to each other by an anisotropic conductive adhesive, a passive element, and a patch antenna are fixed to each other by an anisotropic conductive adhesive, a conductive layer, or the like.

Similarly to Embodiment Mode 2, the first layer 102 having a thin film transistor is formed over the insulating substrate 101. The first layer 102 having a thin film transistor and the second layer 131 having a thin film transistor are fixed to each other by the anisotropic conductive adhesive 133.

The first connection terminal formed on the surface of the first layer 102 having a thin film transistor is electrically connected to the second connection terminal formed on the surface of the second layer having a thin film transistor, by the conductive particles dispersed in the anisotropic conductive adhesive 133.

Similarly to the first layer 102 having a thin film transistor and the second layer 131 having a thin film transistor, the second layer 131 having a thin film transistor and the third layer 132 having a thin film transistor are fixed to each other by the anisotropic conductive adhesive 134.

The third connection terminal formed on the surface of the second layer 131 having a thin film transistor is electrically connected to the fourth connection terminal formed on the surface of the third layer 132 having a thin film transistor, by the conductive particles dispersed in the anisotropic conductive adhesive 134.

The passive element 150 and the third layer 132 having a thin film transistor are fixed to each other by the anisotropic conductive adhesive 135. Here, the passive element 150 is shown by the first passive element 151 and the second passive element 152 similarly to Embodiment Mode 4. Moreover, the connection terminal exposed at the surface of the third layer 132 having a thin film transistor is electrically connected to the first connection terminal of the passive element 150 by the conductive particles in the anisotropic conductive adhesive. A conductive layer formed by curing conductive paste may be used instead of the anisotropic conductive adhesive 135.

Similarly to Embodiment Mode 4, the passive element 150 and the antenna 103 are fixed to each other by the conductive layers 171 and 172. The power feeding layer 113 of the antenna 103, the second connection terminal 168 of the passive element 150, the second conductive layer 112 serving as a ground contact body of the patch antenna, and the third connection terminal 169 of the passive element are respectively connected electrically through the conductive layers 171 and 172. The conductive layers 171 and 172 are formed by curing conductive paste.

This embodiment mode can be appropriately combined with any one of Embodiment Modes 1 to 4.

The wireless chip of this embodiment mode includes an integrated circuit which is formed using the thin film transistor and the passive element formed with a thick film pattern. Therefore, since each circuit is formed using an element having an appropriate function, the wireless chip has composite functions. By mounting the wireless chip of the present invention onto a wiring substrate, the number of mount parts can be decreased. Thus, the dimension of the wiring substrate as well as the size of an electronic appliance having the wiring substrate can be reduced.

Embodiment Mode 6

Figure 6A:
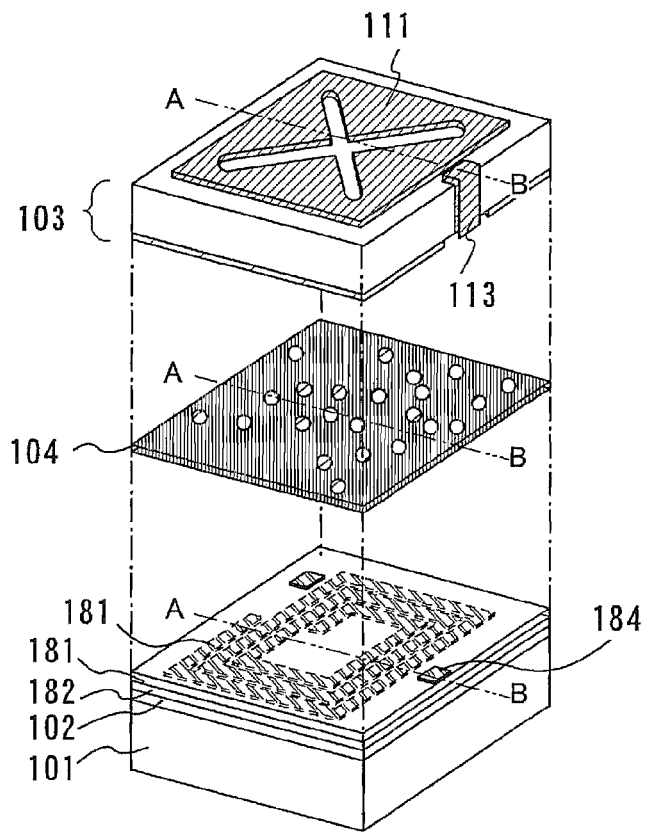
FIGS. 6A and 6B are a development view and a cross-sectional view, showing a wireless chip of the present invention.
Figure 6B:
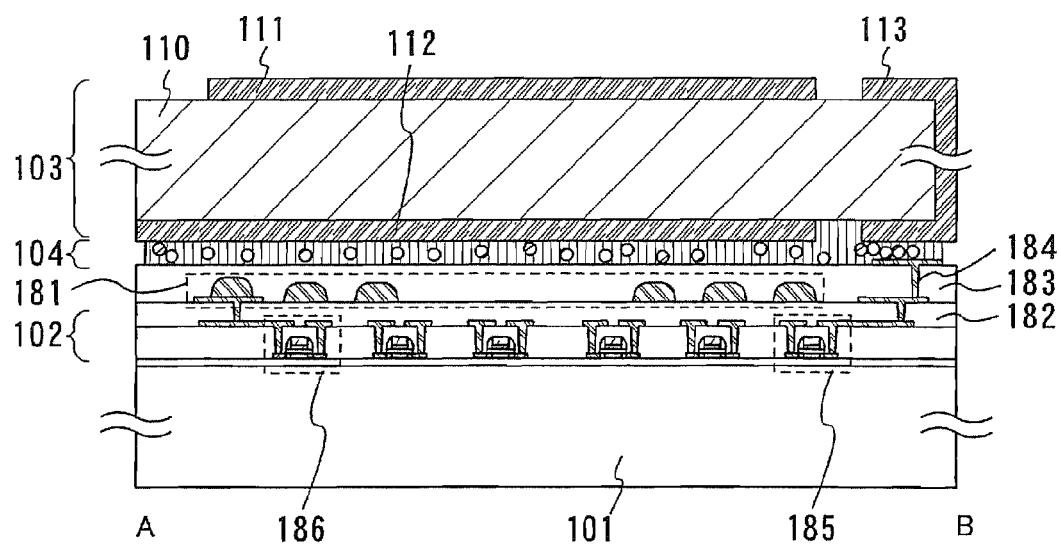

An embodiment mode of a wireless chip of the present invention is shown in FIGS. 6A and 6B. FIG. 6A is a development view of a wireless chip while FIG. 6B is a cross-sectional view taken along a line A-B in FIG. 6A. This embodiment mode will describe a structure of a wireless chip having a plurality of antennas, and particularly a wireless chip having a patch antenna and an antenna provided over a layer having a thin film transistor.

Similarly to Embodiment Mode 1, the layer 102 having a thin film transistor is formed over the insulating substrate 101. Over the layer 102 having a thin film transistor, an interlayer insulating layer 182 is formed. A first antenna 181 is formed over the interlayer insulating layer 182. Over the first antenna 181, an insulating layer 183 is formed, and a connection terminal 184 is formed on a surface of the insulating layer 183.

The insulating layer 183 where the connection terminal 184 is exposed and the patch antenna serving as the second antenna 103 are fixed to each other by the anisotropic conductive adhesive 104. Further, the connection terminal 184 and the power feeding layer 113 of the patch antenna are electrically connected by the conductive particles dispersed in the anisotropic conductive adhesive 104. The connection terminal 184 is electrically connected to a first thin film transistor 185 formed in the layer 102 having a thin film transistor. Moreover, a second thin film transistor 186 formed in the layer 102 having a thin film transistor is connected to the first antenna 181. A conductive layer formed by curing conductive paste may be used instead of the anisotropic conductive adhesive.

The first antenna 181 is formed with a metal material containing aluminum, copper, or silver. For example, a paste-like composition of copper or silver can be formed by screen printing, off-set printing, or ink-jet printing. Alternatively, an aluminum film may be formed by sputtering and patterned by etching. Further, an electroplating method or an electroless plating method may be used.

Figure 8A:
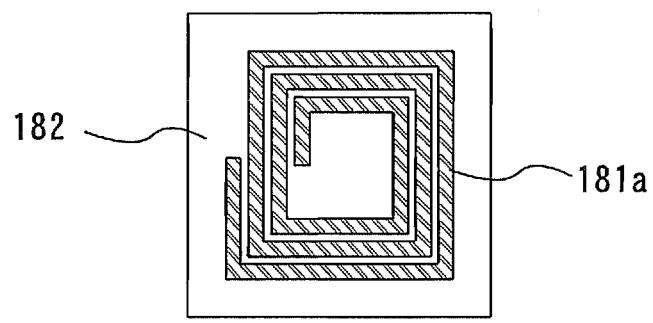
FIGS. 8A to 8C are top views showing an antenna applicable to the present invention.

Here, the first antenna 181 has a shape of a square coil as shown in FIG. 8A.

Figure 8B:
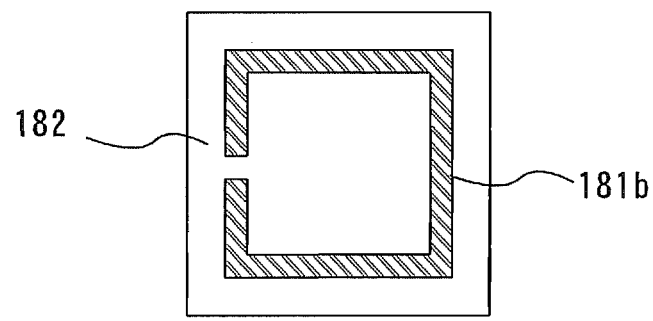
Figure 8C:
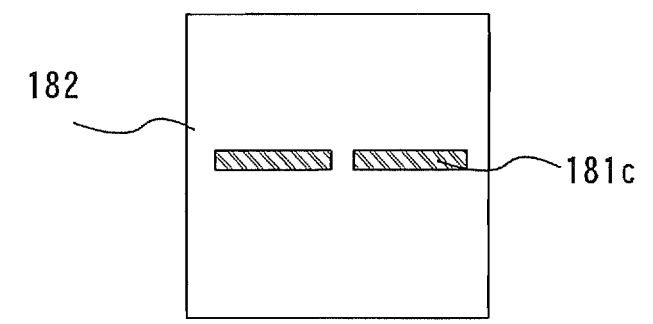

The shape of the first antenna 181 is described with reference to FIGS. 8A to 8C. FIGS. 8A to 8C are top views showing the interlayer insulating layer 182 and an antenna formed over the interlayer insulating layer 182. Although the first antenna 181 has a square coil shape 181a as shown in FIG. 6A and FIG. 8A in this embodiment mode, the shape is not limited to this. The antenna may have a circular coil shape. Further, as shown in FIG. 8B, the antenna can have a square loop shape 181b. The antenna can also have a circular loop shape. Furthermore, as shown in FIG. 8C, the antenna may have a linear-dipole shape 181c. Moreover, the antenna may have a curved-dipole shape.

The present embodiment mode can be appropriately combined with any one of Embodiment Modes 1 to 5.

By providing plural antennas in this way, a multiband-compliant wireless chip capable of receiving many electric waves with one wireless chip can be formed.

The wireless chip of this embodiment mode includes an integrated circuit which is formed using a thin film transistor and the passive element formed with a thick film pattern. Therefore, since each circuit is formed using an element having an appropriate function, the wireless chip has composite functions. By mounting the wireless chip of the present invention onto a wiring substrate, the number of mount parts can be decreased. Thus, the dimension of the wiring substrate as well as the size of an electronic appliance having the wiring substrate can be reduced.

Embodiment 1

This embodiment will describe a method for manufacturing a thin film transistor which can be applied to a wireless chip of the present invention, with reference to FIGS. 15A to 15H and FIGS. 16A to 16H.

Figure 15A:
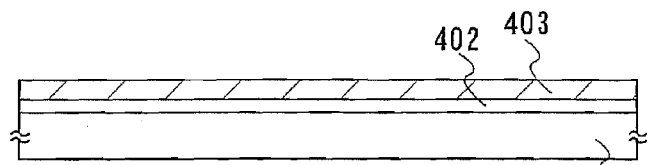
FIGS. 15A to 15H are cross-sectional views showing manufacturing steps of a thin film transistor applicable to the present invention.
Figure 15B:
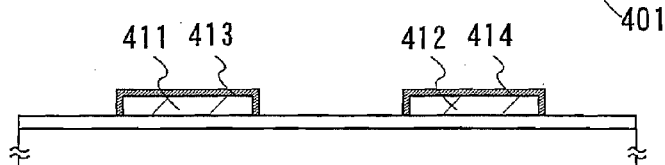

As shown in FIG. 15A, an insulating layer 402 serving as a blocking film is formed over a substrate 401. Next, a crystalline semiconductor layer 403 is formed by a means disclosed in Japanese Patent Application Laid-Open No. 2002-313811. Specifically, after heating an amorphous semiconductor layer to which a catalytic element has been added, the amorphous semiconductor layer is irradiated with laser light to form the crystalline semiconductor layer 403. Next, an insulating layer is formed with an oxide film in 1 to 5 nm thick over the crystalline semiconductor layer, and an amorphous semiconductor layer to which noble gas has been added is formed in 10 to 400 nm thick and heated, so as to form the crystalline semiconductor layer 403 in which the concentration of the catalytic element has decreased.

The amorphous semiconductor layer can be formed with a semiconductor material obtained by a low-pressure thermal CVD method, a plasma CVD method, a sputtering method, or the like, for example silicon or alloy containing silicon as its main component.

Next, after forming a thin oxide film with ozone water on a surface of the crystalline semiconductor layer 403, resist is applied and baked. After that, light-exposure and development are conducted to form a mask. Next, the crystalline semiconductor layer 403 is etched into a desired shape using the mask, thereby forming crystalline semiconductor layers 411 and 412 separated into desired shapes. After forming the crystalline semiconductor layers 411 and 412, the mask is removed (refer to FIG. 15B).

Next, insulating layers 413 and 414 are formed with a thickness of 1 to 10 nm on surfaces of the crystalline semiconductor layers 411 and 412. The insulating layers 413 and 414 are formed on the surfaces of the crystalline semiconductor layers 411 and 412 by UV light irradiation in an oxygen atmosphere, a thermal oxidation method, a process using ozone water including hydroxy radical or hydrogen peroxide, or the like. Alternatively, an insulating layer including silicon oxide is formed all over the surface of the substrate by a plasma CVD method. Here, the insulating layers 413 and 414 are formed with silicon oxide by processing the surface of the crystalline semiconductor layer with ozone water.

Figure 15C:
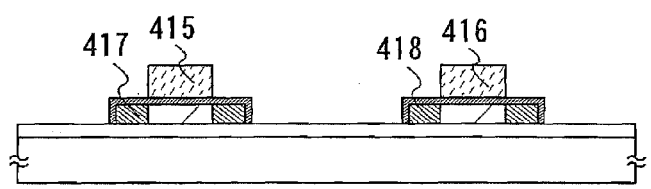

Next, as shown in FIG. 15C, after applying resist and baking the resist, light-exposure and development are conducted to form masks 415 and 416 over the insulating layers 413 and 414. Next, high-concentration impurity regions 417 and 418 are formed by doping the crystalline semiconductor layers 411 and 412 with an impurity element. Here, the doping is conducted by using phosphorus as the impurity element.

Figure 15D:
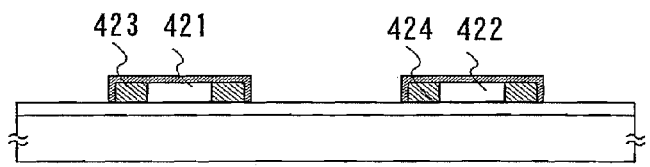

Next, as shown in FIG. 15D, after removing the masks 415 and 416, the crystalline semiconductor layer is heated. Here, the catalytic element remaining in the crystalline semiconductor layers 411 and 412 are dispersed in the high-concentration impurity regions 417 and 418 by heating the crystalline semiconductor layers at 450 to 650° C., so as to decrease the concentration of the catalytic element in regions 421 and 422 of the crystalline semiconductor layer that are covered with the masks.

Figure 15E:
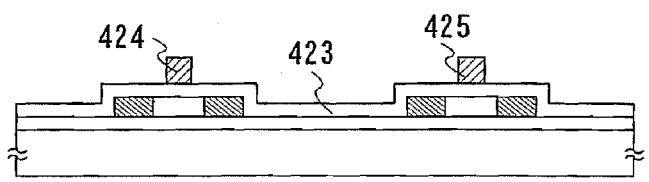

Next, as shown in FIG. 15E, after removing the insulating layers 413 and 414, an insulating layer 423 serving as a gate insulating layer is formed on the surface of the substrate. Here, an insulating layer 423 is formed with silicon oxide by a CVD method.

Next, conductive layers 424 and 425 serving as a gate electrode are formed over the insulating layer 423. The conductive layers 424 and 425 can be formed by a similar method to the gate electrode of the thin film transistor 106 shown in Embodiment Mode 1.

Figure 15F:
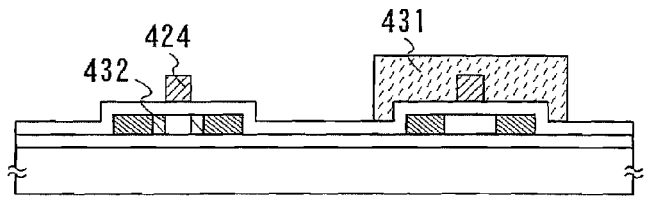

Next, as shown in FIG. 15F, after applying resist and baking the resist, light-exposure and development are conducted to form a mask 431 over the crystalline semiconductor layer 412. Then, the crystalline semiconductor layer 411 is doped with an impurity element using the conductive layer 424 as a mask, thereby forming a low-concentration impurity region 432. Here, the doping is conducted by using phosphorus as the impurity element.

Figure 15G:
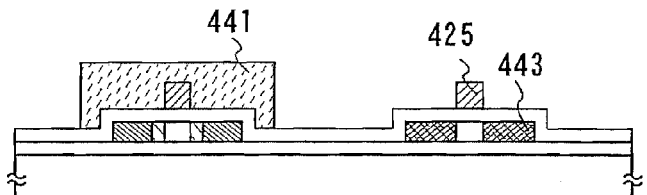
Figure 15H:
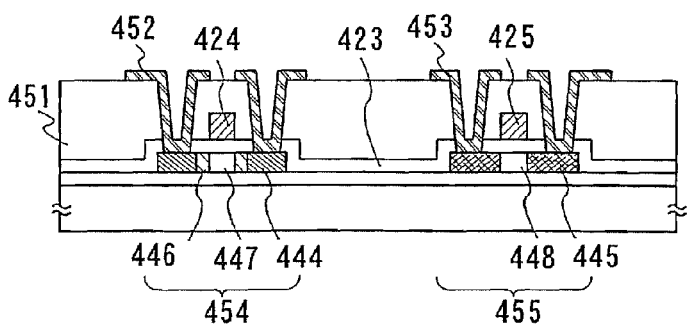

Subsequently, as shown in FIG. 15G after removing the mask 431, a mask 441 is formed over the crystalline semiconductor layer 411 by the similar step to the mask 431. Next, the crystalline semiconductor layer 412 is doped with an impurity element using the conductive layer 425 as a mask, thereby forming a high-concentration impurity region 443. Here, the doping is conducted by using boron as the impurity element.

Next, after forming an insulating layer over the substrate, a hydrogenation process of the crystalline semiconductor layer and activation of the impurity in the low-concentration impurity region and the high-concentration impurity region are conducted, thereby forming source and drain regions 444 imparting n-type conductivity and source and drain regions 445 imparting p-type conductivity, and a low-concentration impurity region 446 imparting n-type conductivity.

Next, after forming an insulating layer 451 over the substrate, a part of the insulating layer 451 is removed to expose the source and drain regions 444 and 445. Next, source and drain electrodes 452 and 453 are formed.

By these steps, an n-channel thin film transistor 454 having the source and drain regions 444 imparting n-type conductivity, a channel formation region 447, the insulating layer 423 serving as a gate insulating layer, the conductive layer 424 serving as a gate electrode, and the source and drain electrodes 452 can be formed. Moreover, a p-channel type thin film transistor 455 having the source and drain regions 445 imparting p-type conductivity, a channel formation region 448, the insulating layer 423 serving as a gate insulating layer, the conductive layer 425 serving as a gate electrode, and the source and drain electrodes 453 can be formed.

Moreover, a CMOS circuit can be manufactured by connecting the source or drain electrode of the n-channel type thin film transistor 454 to the source or drain electrode of the p-channel thin film transistor 455.

Next, an example of manufacturing steps of a thin film transistor, which are different from the steps shown in FIGS. 15A to 15H in point of the step of manufacturing the crystalline semiconductor layers 411 and 412 and the insulating layer formed on the surfaces thereof, is described with reference to FIGS. 16A to 16H.

Figure 16A:
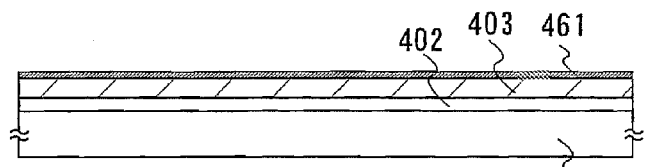
FIGS. 16A to 16H are cross-sectional views showing manufacturing steps of a thin film transistor applicable to the present invention.
Figure 16B:
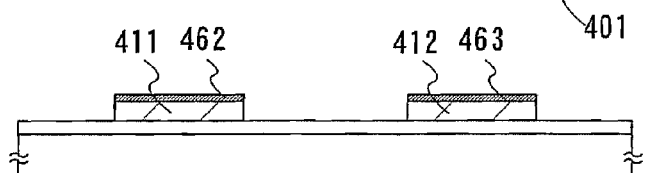

As shown in FIG. 16A, the insulating layer 402 serving as a blocking film is formed over the substrate 401 similarly to FIG. 15A. Next, the crystalline semiconductor layer 403 is formed.

Next, an insulating layer 461 is formed with a thickness of 1 to 10 nm on a surface of the crystalline semiconductor layer 403. The insulating layer 461 can be formed by the similar step to the insulating layers 413 and 414 shown in FIG. 15B.

Next, after applying resist and baking the resist, light-exposure and development are conducted to form a mask. Next, the insulating layer 461 and the crystalline semiconductor layer 403 are etched into desired shapes using the mask, thereby forming insulating layers 462 and 463 and the crystalline semiconductor layers 411 and 412 separated into desired shapes. After forming the crystalline semiconductor layers 411 and 412, the mask is removed (refer to FIG. 16B).

Next, after applying resist and baking the resist, light-exposure and development are conducted to form masks 415 and 416 over the insulating layers 462 and 463.

Figure 16C:
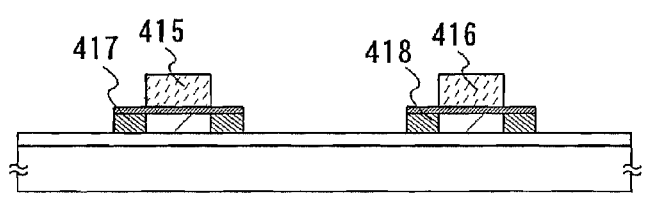

Next, as shown in FIG. 16C, the crystalline semiconductor layers 411 and 412 are doped with an impurity element to form high-concentration impurity regions 417 and 418. Here, the doping is conducted by using phosphorus as the impurity element.

Figure 16D:
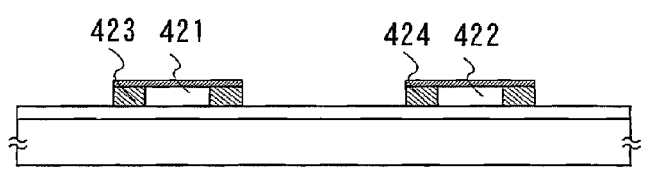

Subsequently, as shown in FIG. 16D, after removing the masks 415 and 416, the crystalline semiconductor layers 411 and 412 are heated. Here, the catalytic elements remaining in the crystalline semiconductor layers are heated at 450 to 650° C. to disperse the catalytic elements in the high-concentration impurity regions 417 and 418, so as to decrease the concentration of the catalytic element in the regions in the crystalline semiconductor layer that are covered with the masks.

Figure 16E:
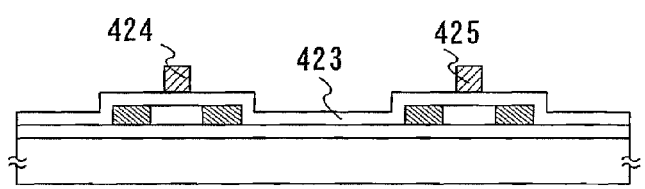
Figure 16F:
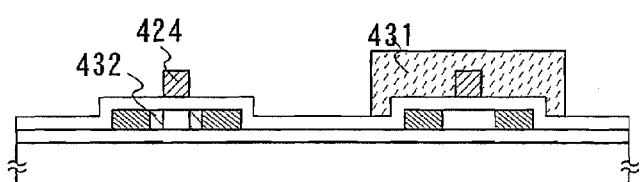
Figure 16G:
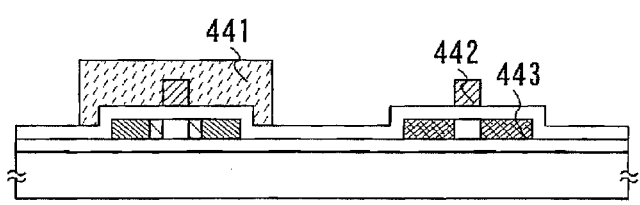
Figure 16H:
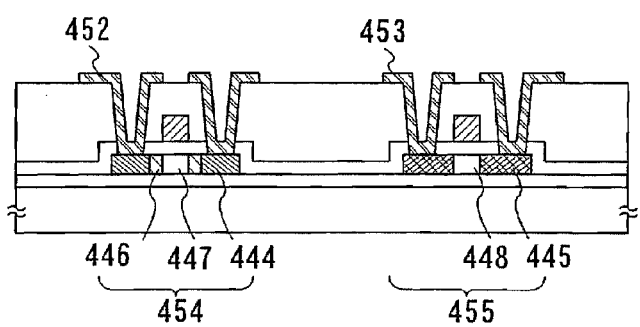

Next, as shown in FIG. 16E, after removing the insulating layers 462 and 463 over the crystalline semiconductor layers 411 and 412, the insulating layer 423 serving as the gate insulating layer is formed on the surface of the substrate. Here, the insulating layer 423 is formed with silicon oxide by a CVD method.

By the steps shown in FIGS. 15E to 15H, the n-channel type thin film transistor 454 and the p-channel thin film transistor 455 can be formed.

Since the step of decreasing the concentration of the catalytic element in the crystalline semiconductor layer is conducted twice in forming the thin film transistors 454 and 455 in this embodiment, the concentration of the catalytic element in the crystalline semiconductor layer is decreased. This makes it possible to decrease the on-current of the thin film transistors 454 and 455.

This embodiment can be appropriately combined with any one of the above Embodiment Modes.

Embodiment 2

Figure 11A:
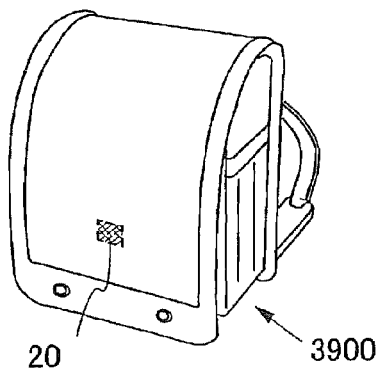
FIGS. 11A to 11F show application examples of a wireless chip of the present invention.
Figure 11B:
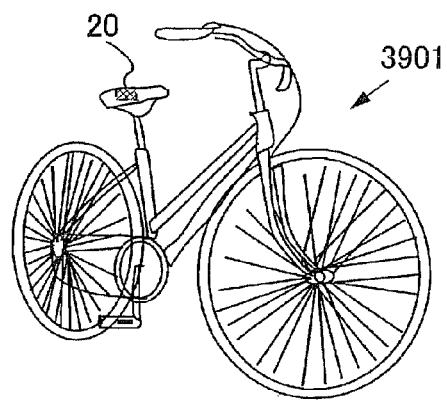
Figure 11C:
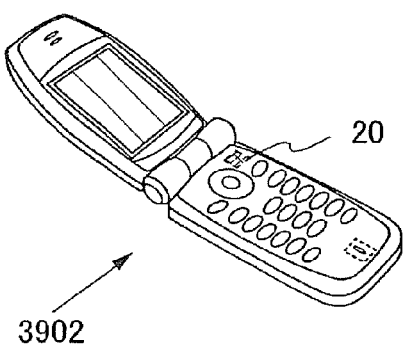
Figure 11D:
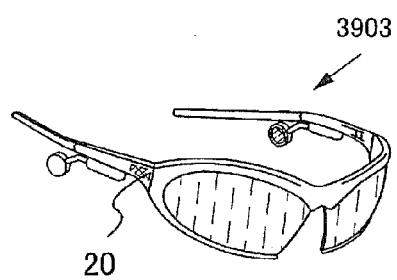
Figure 11E:
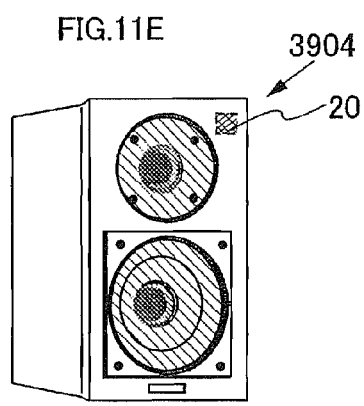
Figure 11F:
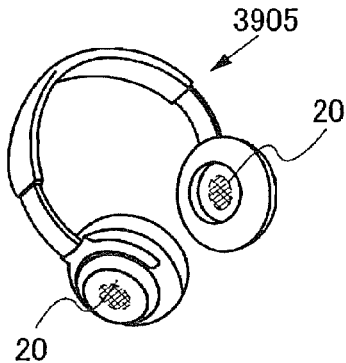

The wireless chips of the present invention can be applied to a wide range. For example, a wireless chip 20 can be provided to vehicles (a bicycle 3901 (see FIG. 11B), cars, and the like), foods, plants, cloths, general merchandise (a bag 3900 (see FIG. 11A) and the like), electronic appliances, inspection devices, and the like. The electronic appliances include a liquid crystal display device, an EL display device, a television device (also referred to as a TV simply, a TV receiver, or a television receiving machine), a mobile phone 3902 (see FIG. 11C), a printer, a camera, a personal computer, a goggle 3903 (see FIG. 11D), a speaker device 3904 (see FIG. 11E), a headphone 3905 (see FIG. 11F), a navigation device, an electronic key, and the like.

By providing the wireless chip 20 of the present invention to the bag 3900, the bicycle 3901, and the like, it is possible to detect where these exist by GPS. As a result, it is possible to find stolen bicycles. Further, searching for missing people becomes easy.

Further, by providing the wireless chip 20 in the mobile phone 3902, sending and receiving of information and telephone become possible.

Moreover, by providing the wireless chip of the present invention in the earphone-equipped goggle 3903, the speaker device 3904, and the headphone 3905, it is possible to enjoy music played with an audio device without a connection to the audio device using a cord. Moreover, a compact hard disk (storage device) may be provided together with the wireless chip 20 in the earphone-equipped goggle 3903. Moreover, in the case that the wireless chip 20 has a central processing unit, an audio signal encoded in the audio device can be received, decoded, and amplified with the earphone-equipped goggle 3903, the headphone 3905, and the speaker device 3904. Therefore, the audio can be heard with high confidentiality. Moreover, because the cord is not necessary, the earphone-equipped goggle 3903 and the headphone 3905 can be mounted easily, thereby the provision of the speaker device 3904 is easy. It is preferable that, in this case, the speaker device be provided with a battery.

The wireless chip of the present invention is fixed to a product by mounting the wireless chip onto a print substrate, pasting the wireless chip to a surface thereof, or embedding the wireless chip therein. For example, if the product is a package including an organic resin, the wireless chip is fixed to the product by embedding the wireless chip into the organic resin. When the wireless chip of the present invention is provided to products such as foods, plants, animals, human bodies, cloths, general merchandise, electronic appliances, and the like, systems such as an inspection system can be made efficient.

Figure 13:
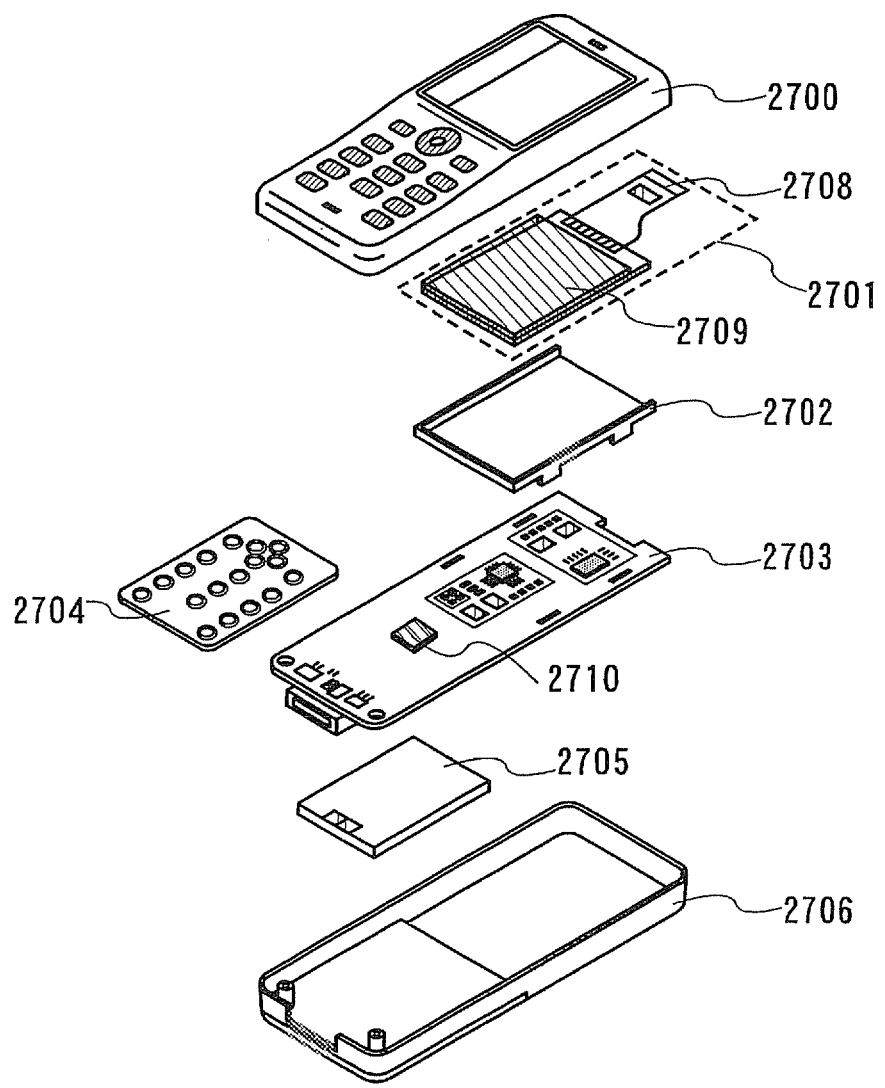
FIG. 13 shows a development view showing an application example of a wireless chip of the present invention.

Next, a mode of the electronic appliance to which the wireless chip of the present invention has been mounted will be described with reference to the drawings. The electronic appliance to be exemplified here is a mobile phone, including cases 2700 and 2706, a panel 2701, a housing 2702, a print wiring substrate 2703, an operation button 2704, a battery 2705, and the like (see FIG. 13). The panel 2701 is removably incorporated in the housing 2702 and the housing 2702 is fixed into the print wiring substrate 2703. The shape and size of the housing 2702 changes appropriately in accordance with the electronic appliance into which the panel 2701 is to be incorporated. On the print wiring substrate 2703, a plurality of packaged semiconductor devices are mounted. The semiconductor devices to be mounted on the print wiring substrate 2703 have any function selected from a controller, a central processing unit, a memory, a power source circuit, an audio process circuit, a send/receive circuit, and the like. Moreover, a wireless chip 2710 of the present invention can be used.

The panel 2701 is connected to the print wiring substrate 2703 through a connection film 2708. The above panel 2701, housing 2702, and print wiring substrate 2703 are housed inside the cases 2700 and 2706 together with the operation button 2704 and the battery 2705. A pixel region 2709 in the panel 2701 is provided so as to be observed through an opening window provided in the case 2700.

It is to be noted that the shapes of the cases 2700 and 2706 are just an example of an exterior shape of the mobile phone, and the electronic appliance of the present invention can be modified into various modes in accordance with the function and intended purpose.

Figure 14:
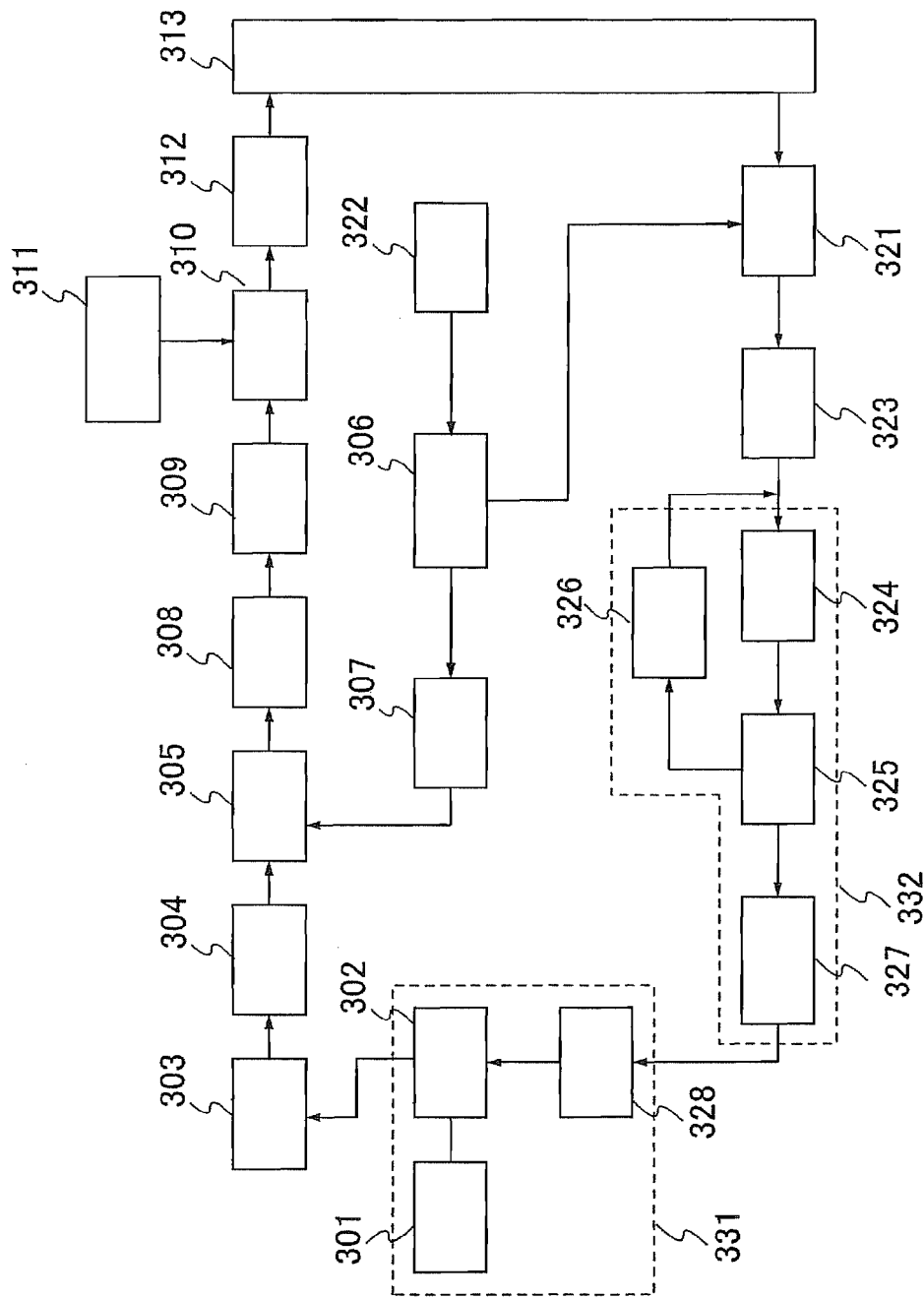
FIG. 14 shows a high-frequency circuit applicable to the present invention.

Here, a block diagram of a high-frequency circuit typified by a data modulation/demodulation circuit of a mobile phone is described with reference to FIG. 14.

First, a step of sending a signal, which has been received with an antenna, to a base band unit is described. The received signal inputted into an antenna 301 is inputted into a low noise amplifier (LNA) 303 from a duplexer 302 and amplified to be a predetermined signal. The received signal inputted into the low noise amplifier (LNA) 303 is inputted into a mixer 305 through a band pass filter (BPF) 304. Into this mixer 305, an RF signal from a mixture circuit 306 is inputted, and an RF signal component is removed in a band pass filter 307 and demodulated. The received signal outputted from the mixer 305 is inputted into a mixer 310 after being amplified in an amplifier 309 through a SAW filter 308. Into the mixer 310, a local oscillation signal of a predetermined frequency from a local oscillator circuit 311 is inputted and converted into a desired frequency, and amplified into a predetermined level in an amplifier 312. Then, the signal is sent to a base band unit 313. The antenna 301, the duplexer 302, and a low pass filter 328 are shown as an antenna front end module 331.

Next, a step of oscillating a signal, which has been sent from a base band unit, with an antenna is described. The transmission signal sent from the base band unit 313 is mixed with the RF signal from the mixture circuit 306 by a mixer 321. This mixture circuit 306 is connected to a voltage control oscillator circuit (VCO) 322, and supplies an RF signal of the predetermined frequency.

The transmission signal which has been RF-modulated by the mixer 321 is amplified by a power amplifier (PA) 324 through a band pass filter (BPF) 323. A part of the output from the power amplifier (PA) 324 is taken out from a coupler 325 and adjusted to have a predetermined level by an attenuator (APC) 326. Then, the output is inputted into the power amplifier (PA) 324 again and adjusted so that a transmission gain of the power amplifier (PA) 324 becomes constant. The transmission signal sent from the coupler 325 is inputted into the duplexer 302 through an isolator 327 for backflow prevention and a low pass filter (LPF) 328, and sent from the antenna 301 connected to the duplexer 302. The attenuator (APC) 326, the power amplifier (PA) 324, the coupler 325, and the isolator 327 are shown as an isolator power amplifier module 332.

Since the wireless chip of the present invention has the above high-frequency circuit, the number of parts can be reduced. Therefore, the number of mount parts on the wiring substrate can be decreased, so that the dimension of the wiring substrate can be reduced. As a result, the mobile phone can be reduced in size.

Figure 12A:
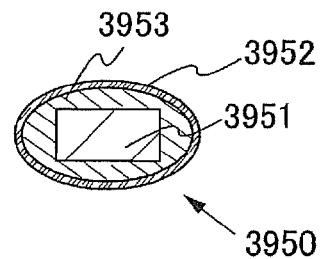
FIGS. 12A to 12D show application examples of a wireless chip of the present invention.

Next, an example of an inspection device which can wirelessly send detected functional data of a biological body is described with reference to FIGS. 12A and 12B. An inspection device 3950 shown in FIG. 12A is provided with a wireless chip 3951 of the present invention inside a capsule 3952 which is coated with a protective layer. A space between the capsule 3952 and the wireless chip 3951 may be filled with a filler 3953.

Figure 12B:
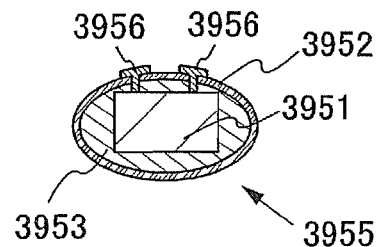

In an inspection device 3955 shown in FIG. 12B, the wireless chip 3951 of the present invention is provided inside the capsule 3952 which is coated with a protective layer. An electrode 3956 of the wireless chip is exposed at the outside of the capsule 3952. A space between the capsule 3952 and the wireless chip 3951 may be filled with the filler 3952.

The wireless chip 3951 in the inspection devices 3950 and 3955 is a wireless chip having the detection portion shown in FIG. 9C. The physical amount or the chemical amount is measured in the detection portion to detect functional data of a biological body. The detected result can be converted into signals and sent to a reader/writer. In the case of detecting the physical amount such as the amount of pressure, light, or acoustic wave, the inspection device 3950 in which the electrode is not exposed at the outside of the capsule 3952 as shown in FIG. 12A can be used. Moreover, in the case of detecting temperature, flow rate, magnetism, acceleration, humidity, a gas constituent, a chemical substance such as liquid constituent like ions, and the like, the inspection device 3950 in which the electrode 3956 is exposed at the outside of the capsule 3952 as shown in FIG. 12B is preferably used.

In the case of taking an image inside of a body with the use of the inspection device, the inspection device may be provided with a light-emitting device such as an LED or EL. This makes it possible to take an image inside a body.

The protective layer provided on the surface of the capsule preferably contains diamond-like carbon (DLC), silicon nitride, silicon oxide, silicon oxynitride, or carbon nitride. The capsule and the filler may be known ones selected appropriately. By providing the protective layer onto the capsule, it is possible to prevent the capsule and the wireless chip from dissolving or changing in its property inside a body.

In order to send an inspection result from the inspection device to the reader/writer voluntarily, the inspection device may be provided with a known battery.

Figure 12C:
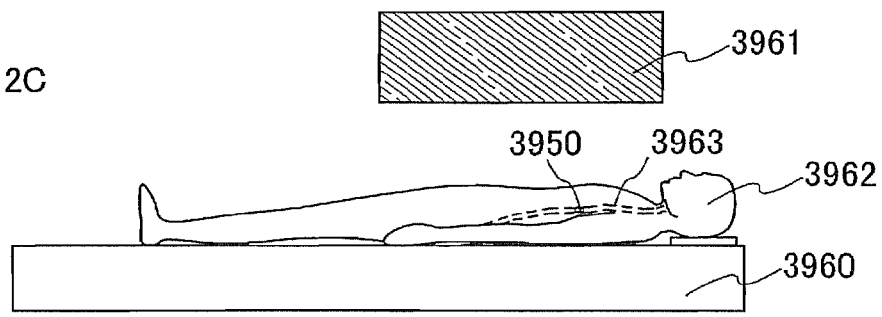

Next, a method of using the inspection device is described. As shown in FIG. 12C, an examinee 3962 swallows the inspection device 3950 or 3955 and let the inspection device 3950 or 3955 move inside a cavity 3963 in a body. A result detected by the detection portion in the wireless chip is sent to the reader/writer 3961 provided near the examinee. This result is received with the reader/writer. As a result, it is possible to detect functional data of the biological body of the examinee at this place without collecting the wireless chip. Moreover, images inside the cavity of the body and digestive organs can be taken.

Figure 12D:
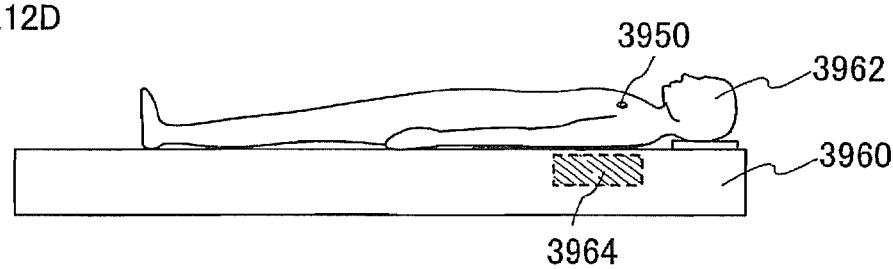

Further, as shown in FIG. 12D, the result detected by the detection portion in the wireless chip is sent to the reader/writer 3964 provided near the examinee by embedding the inspection device 3950 or 3955 inside the body of the examinee 3962. In this case, the inspection device 3955 is embedded in the body so that the electrode 3956 is in contact with a portion of the examinee's body to be measured. The reader/writer receives this result. The received result is recorded in a biological information management computer and processed therein, so that the biological information of the examinee can be managed. By providing the reader/writer 3964 in a bed 3960, it is possible to detect, in any time, biological information of examinees who suffer from dysfunction and find it difficult to move around and to manage medical states or health conditions of the examinees.

This embodiment can be appropriately combined with any one of the above Embodiment Modes.

Embodiment 3

Figure 17:
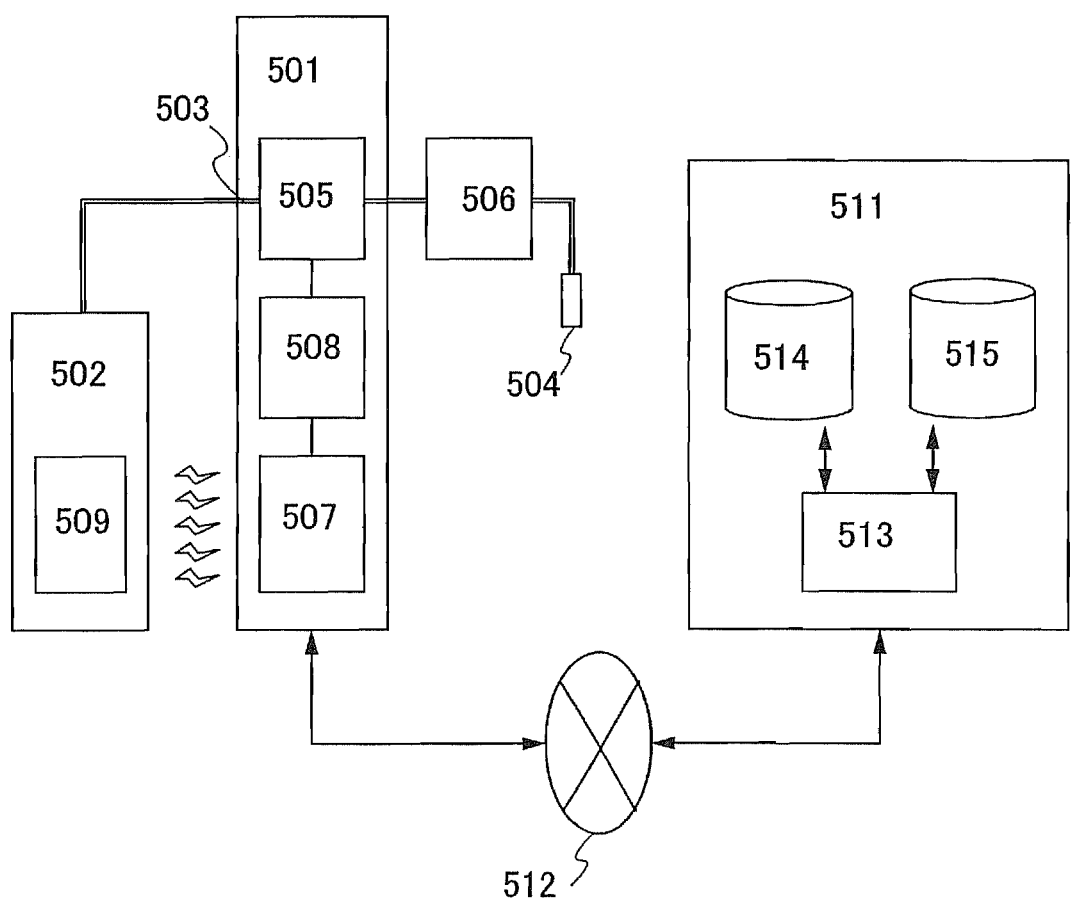
FIG. 17 shows an application example of a wireless chip of the present invention.

This embodiment will describe a management system at distribution of a container filled with a fluid from a manufacturer to a delivery agent and the like, with reference to FIG. 17.

A management system of a container filled with a fluid shown in FIG. 17 includes a supplier 501 and a container 502 filled with a fluid. The supplier 501 is provided with an introduction tube 503 for introducing the fluid from the container, a supplying nozzle 504 for supplying the fluid to the outside, a first valve 505 for controlling movement of the fluid introduced from the introduction tube to the supplying nozzle, a second valve 506 which controls movement of the fluid from the first valve to the supplying nozzle, a reader/writer 507 which reads information stored in a wireless chip, and a control portion 508 which controls the first valve based on a signal sent from the reader/writer.

The container 502 is provided with the wireless chip 509 shown in Embodiment Modes and Embodiments as above. In the wireless chip 509, information of the fluid filling the container 502, such as a manufacturing date, a manufacturer, and a material are stored. The information is managed at a management center 511 in the manufacturer. The wireless chip 509 may be provided with a battery. By providing a battery, the wireless chip can voluntarily send information to the reader/writer. Further, the wireless chip 509 may have a detection portion. The information about the fluid detected in the detection portion can be sent to the management center of the manufacturer through the reader/writer and an interface.

The container 502 is formed with metal, plastic, ceramic, or the like.

As typical examples of the fluid filling the container 502, liquid such as drinkable water, hot spring water, or daily life water; gas such as propane gas, natural gas, hydrogen gas, oxygen gas, or nitrogen gas; or gel-like fluid such as paste, ice cream, or soup is given.

When the container 502 is connected to the supplier 501, the reader/writer 507 of the supplier 501 reads information stored in the wireless chip 509 of the container 502. Next, the information read by the reader/writer is sent to the management center 511 of the manufacturer through an interface 512. The interface 512 sends the information stored in the wireless chip 509 to the outside and serves as a terminal-side information sending/receiving means for receiving a signal from the management center 511. Internet, a telephone line, or the like can be used as the interface 512.

The information of the fluid sent from the interface 512 is sent to a server 513 in the management center 511 of the manufacturer. The information of the fluid, specifically a used-by date, an expiration date, a manufacturer, and a material, are judged at the server 513 in the management center. In the case that the wireless chip 509 is provided with a detection portion, it is possible to receive various information of the fluid like the freshness, the temperature, and the like, in addition to the above information of the fluid. Here, whether the fluid is supplied or not is judged by judging the conformity of the choice of the container 502 and the supplier 501, and the used-by date, the expiration date, and the manufacturer of the fluid, based on a shipment list 514 of the containers and a list 515 of the used containers. In the management center 511 of the manufacturer, the shipment list 514 of the containers and the list 515 of the used containers are stored in the server 513.

Next, the judgment result on whether the fluid is supplied or not is sent from the management center 511 to the supplier 501. The transmission result from the management center is received with the reader/writer 507 of the supplier 501. If the fluid is to be supplied, a signal is sent to the control portion 508 of the supplier, and the first valve 505 is opened. When a store clerk opens the second valve 506, the fluid can be supplied to the outside through the supplying nozzle 504. It is preferable that the first valve 505 be automatically controllable, and the first valve 505 can be formed with an electromagnetic valve. It is preferable that the second valve 506 be manually controllable or automatically controllable and the second valve 506 can be formed with a manual valve or an automatic valve. If the second valve 506 is automatically controllable, the opening and closing of the valve is controlled with an electromagnetic valve connected to a switch operated by a store clerk.

By using such a system, the manufacturers can figure out the amount of consumption of the fluid at the delivery agents. Thus, the shipment management of the containers filled with the fluid can be carried out automatically, which simplifies the step of shipping and receiving orders at the delivery agents and the manufacturers.

Since the opening and closing of the first valve 505 is controlled by the information stored in the wireless chip 509, it becomes possible to control the supplying of the fluid automatically. Therefore, it can be prevented that the fluid beyond the used-by date and the expiration date, the fluid which has been deteriorated because of being in a poor state of preservation, and the like are provided to purchasers.

Moreover, it is possible to discriminate the container 502 and the fluid filling the container 502 manufactured by one's company from containers and fluid manufactured by the other companies, based on the information stored in the wireless chip 509. Therefore, it is possible to prevent the fluid of the same kind manufactured by the other company from being supplied in connection with the supplier manufactured by the one's company.

This embodiment can be appropriately combined with any one of the above Embodiment Modes. This application is based on Japanese Patent Application serial no. 2005-064271 filed in Japan Patent Office on March 8, in 2005, the contents of which are hereby incorporated by reference.

What is claimed is:

1. A wireless device comprising:
    a first layer having a transistor;
    a first connection terminal which is formed on a surface of the first layer;
    a second layer having one or more passive elements selected from an inductor, a capacitor, and a resistor;
    a second connection terminal formed on a first plane of the second layer;
    a third connection terminal formed on a second plane which opposes to the first plane;
    an antenna having a first conductor, a second conductor, and a third conductor electrically connected to the third connection terminal,
    wherein the first layer and the second layer are electronically connected to each other,
    wherein the second conductor comprises a first region, a second region and a third region between the first region and the second region,
    wherein the second conductor is bent so that a surface of the first region is parallel to a surface of the second region,
    wherein the second conductor is separated by a first gap with the first conductor and by a second gap with the third conductor, and
    wherein the first conductor has a first surface facing the third conductor and a second surface opposing to the first surface.

2. A wireless device according to claim 1, wherein the first layer is formed by stacking plural layers having transistors.

3. A wireless device according to claim 1, wherein the transistor is a thin film transistor.

4. A wireless device according to claim 1, wherein the first layer and the second layer are provided on the second surface.

5. A wireless device according to claim 1, wherein a dielectric layer is sandwiched between the first conductor and the third conductor, wherein the dielectric layer is in contact with the first conductor and the third conductor.

6. A wireless device according to claim 1, further comprising a connection layer for electrically connecting the first connection terminal and the second connection terminal.

7. A wireless device according to claim 1, wherein the first conductor is wider than the second conductor.

8. A wireless device comprising:
    a first layer having a first transistor;
    a first connection terminal which is formed on a surface of the first layer;
    a second layer having a second transistor;
    a second connection terminal formed on a first plane of the second layer;
    a third connection terminal formed on a second plane of the second layer which opposes to the first plane;
    an antenna having a first conductor, a second conductor, and a third conductor electrically connected to the third connection terminal,
    wherein the first layer and the second layer are electrically connected to each other,
    wherein the second conductor comprises a first region, a second region and a third region between the first region and the second region,
    wherein the second conductor is bent so that a surface of the first region is parallel to a surface of the second region,
    wherein the second conductor is separated by a first gap with the first conductor and by a second gap with the third conductor, and
    wherein the first conductor has a first surface facing the third conductor and a second surface opposing to the first surface.

9. A wireless device according to claim 8, wherein the first layer, and the second layer have thicknesses from 1 µm to 10 µm.

10. A wireless device according to claim 8, wherein the first layer, and the second layer have thicknesses from 1 μm to 5 μm.

11. A wireless device according to claim 8, wherein one of the first transistor and the second transistor is a thin film transistor.

12. A wireless device according to claim 8, wherein the first layer and the second layer are provided on the second surface.

13. A wireless device according to claim 8,
wherein a dielectric layer is sandwiched between the first conductor and the third conductor,
wherein the dielectric layer is in contact with the first conductor and the second conductor.

14. A wireless device according to claim 8, further comprising a connection layer for electrically connecting the first connection terminal and the second connection terminal.

15. A wireless device according to claim 8, wherein the first conductor is wider than the second conductor.

16. A wireless device comprising:
a circuit; and
an antenna having a first conductor, a second conductor and a third conductor,
wherein the circuit is configured to transmit a signal to at least one of the first conductor, the second conductor and the third conductor,
wherein the second conductor comprises a first region, a second region and a third region between the first region and the second region,
wherein the second conductor is bent so that a surface of the first region is parallel to a surface of the second region,
wherein the second conductor is separated by a first gap with the first conductor and by a second gap with the third conductor, and
wherein the first conductor has a first surface facing the third conductor and a second surface opposing to the first surface.

17. A wireless device according to claim 16, wherein the circuit comprises a thin film transistor.

18. A wireless device according to claim 16, wherein the circuit is provided on the second surface.

19. A wireless device according to claim 16,
wherein a dielectric layer is sandwiched between the first conductor and the third conductor,
wherein the dielectric layer is in contact with the first conductor and the second conductor.

20. A wireless device according to claim 16, wherein the first conductor is wider than the second conductor.

* * * * *

UNITED STATES PATENT AND TRADEMARK OFFICE
CERTIFICATE OF CORRECTION

PATENT NO. : 8,455,954 B2
APPLICATION NO. : 13/445262
DATED : June 4, 2013
INVENTOR(S) : Suzuki et al.

It is certified that error appears in the above-identified patent and that said Letters Patent is hereby corrected as shown below:

In the Specification

At column 13, line 47, "Light-exposing" should be -- light-exposing --;

At column 16, line 42, "fowled" should be -- formed --;

At column 22, line 34, "1511" should be -- 15H --;

In the Claims

In claim 1, at column 28, lines 8-9, "electronically" should be -- electrically --.

Signed and Sealed this
Fifteenth Day of October, 2013

Teresa Stanek Rea
*Deputy Director of the United States Patent and Trademark Office*